(12) United States Patent
Takahashi et al.

(10) Patent No.: US 8,359,738 B2
(45) Date of Patent: Jan. 29, 2013

(54) METHOD OF MANUFACTURING WIRING BOARD

(75) Inventors: Michimasa Takahashi, Ogaki (JP);
Masakazu Aoyama, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 13/215,653

(22) Filed: Aug. 23, 2011

(65) Prior Publication Data

US 2011/0296679 A1   Dec. 8, 2011

Related U.S. Application Data

(62) Division of application No. 12/146,279, filed on Jun. 25, 2008, now Pat. No. 8,178,789.

(60) Provisional application No. 60/950,229, filed on Jul. 17, 2007.

(51) Int. Cl.
*H05K 3/36* (2006.01)

(52) U.S. Cl. ............... 29/830; 29/846; 29/852; 174/254

(58) Field of Classification Search .................... 29/830, 29/831, 846, 852; 156/248, 250; 174/254, 174/255; 361/749, 760, 792
See application file for complete search history.

(56) References Cited

U.S. PATENT DOCUMENTS

| | | | |
|---|---|---|---|
| 4,687,695 A * | 8/1987 | Hamby | 174/254 |
| 5,206,463 A * | 4/1993 | DeMaso et al. | 29/852 |
| 5,428,190 A | 6/1995 | Stopperan | |
| 6,212,076 B1 | 4/2001 | MacQuarrie et al. | |
| 7,378,596 B2 | 5/2008 | Kawaguchi et al. | |
| 7,405,948 B2 | 7/2008 | Sato et al. | |
| 7,525,816 B2 | 4/2009 | Sawachi | |
| 7,642,466 B2 | 1/2010 | Nikaido et al. | |
| 8,035,983 B2 | 10/2011 | Takahashi et al. | |
| 8,040,685 B2 | 10/2011 | Takahashi et al. | |
| 2005/0016764 A1 | 1/2005 | Echigo et al. | |
| 2005/0243528 A1 | 11/2005 | Maurayama | |
| 2006/0083895 A1 | 4/2006 | Ikeda | |
| 2006/0180344 A1 | 8/2006 | Ito et al. | |
| 2006/0202344 A1 | 9/2006 | Takada et al. | |

(Continued)

FOREIGN PATENT DOCUMENTS

| | | |
|---|---|---|
| JP | 5-152693 | 6/1993 |
| JP | 11-074651 | 3/1999 |

(Continued)

OTHER PUBLICATIONS

U.S. Appl. No. 13/187,995, filed Jul. 21, 2011, Takahashi, et al.

*Primary Examiner* — Donghai D. Nguyen
(74) *Attorney, Agent, or Firm* — Oblon, Spivak, McClelland, Maier & Neustadt, L.L.P.

(57) ABSTRACT

A method of manufacturing a wiring board including forming a first wiring board, the forming of the first board including forming a substrate, forming a first insulation layer on a surface of the substrate and a second insulating layer on the opposite surface of the substrate, forming a via in one of the layers, and cutting the first layer in a first area and cutting the second layer in a second area offset from the first area to form a first substrate laminated to a second substrate with the substrate interposed therebetween, the second substrate having a smaller mounting area than that of the first substrate such that the first substrate extends beyond edge of the second substrate, connecting a pliable member to the substrate, and connecting the member to a second wiring board to connect the first and second boards. One or more insulation layers are a non-pliable layer.

16 Claims, 22 Drawing Sheets

U.S. PATENT DOCUMENTS

| | | |
|---|---|---|
| 2006/0218782 A1 | 10/2006 | Tuominen et al. |
| 2008/0283276 A1 | 11/2008 | Takahashi et al. |
| 2008/0283287 A1 | 11/2008 | Takahashi et al. |
| 2011/0209344 A1 | 9/2011 | Takahashi et al. |
| 2011/0247212 A1 | 10/2011 | Takahashi et al. |
| 2011/0252640 A1 | 10/2011 | Takahashi et al. |

FOREIGN PATENT DOCUMENTS

| | | |
|---|---|---|
| JP | 11-172457 | 6/1999 |
| JP | 2000-013019 | 1/2000 |
| JP | 2002-064271 | 2/2002 |
| JP | 2004-266236 | 9/2004 |
| JP | 2004-349277 | 12/2004 |
| JP | 2005-079402 | 3/2005 |
| JP | 2005-236205 | 9/2005 |
| JP | 2005-268505 | 9/2005 |
| JP | 2005-336287 | 12/2005 |
| JP | 2006/114741 | 4/2006 |
| JP | 2006/202891 | 8/2006 |
| JP | 2006-216785 | 8/2006 |

* cited by examiner

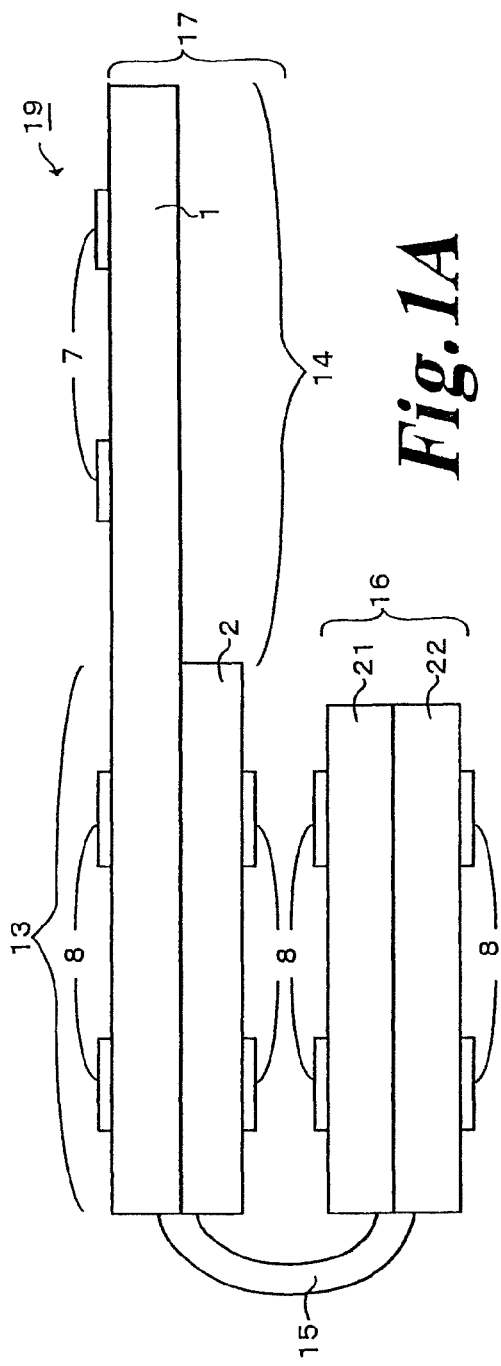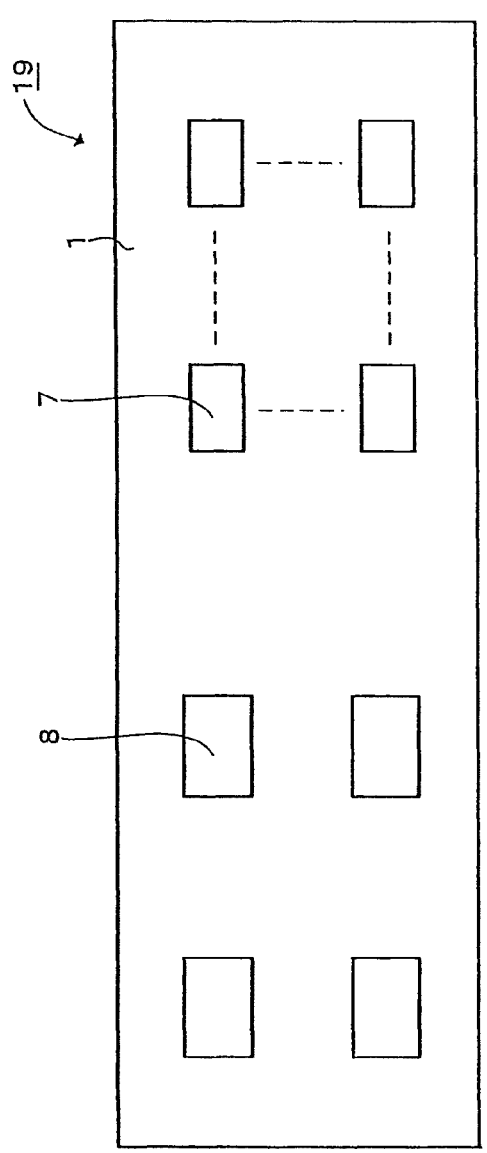

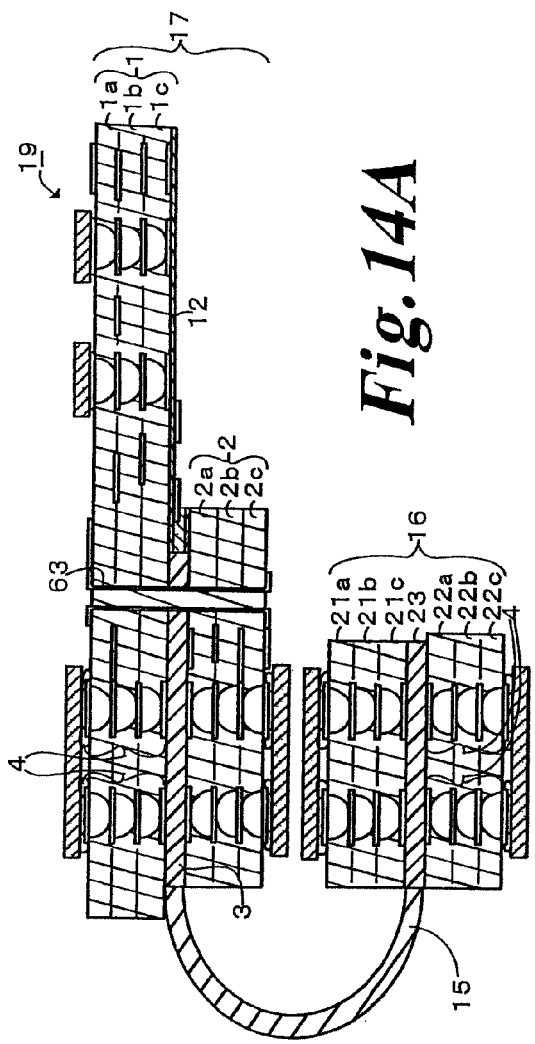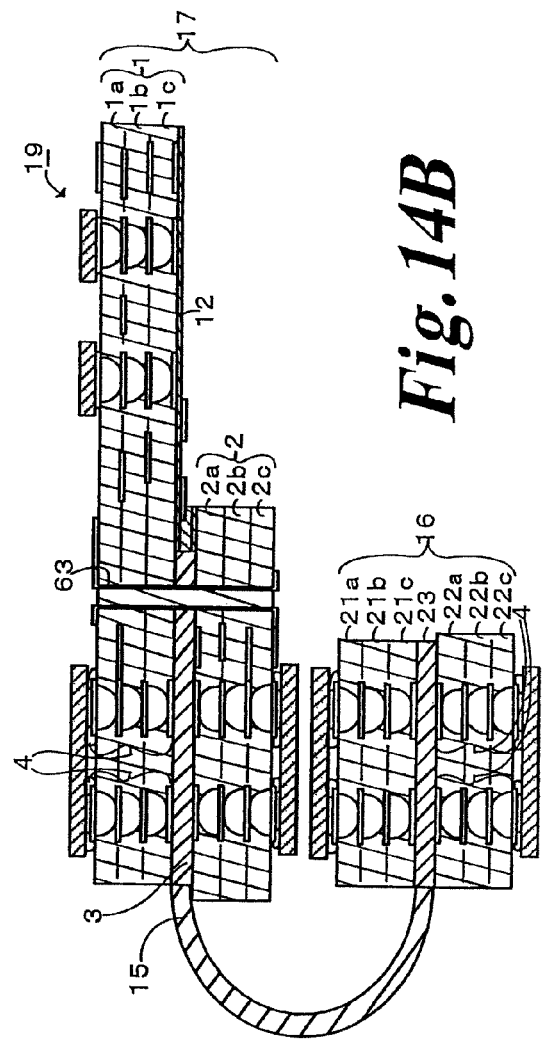

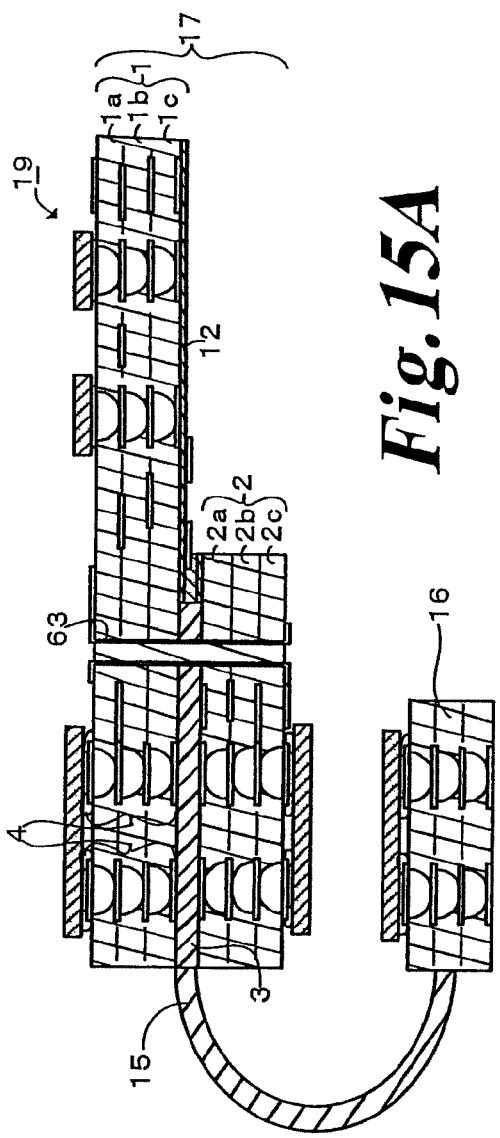
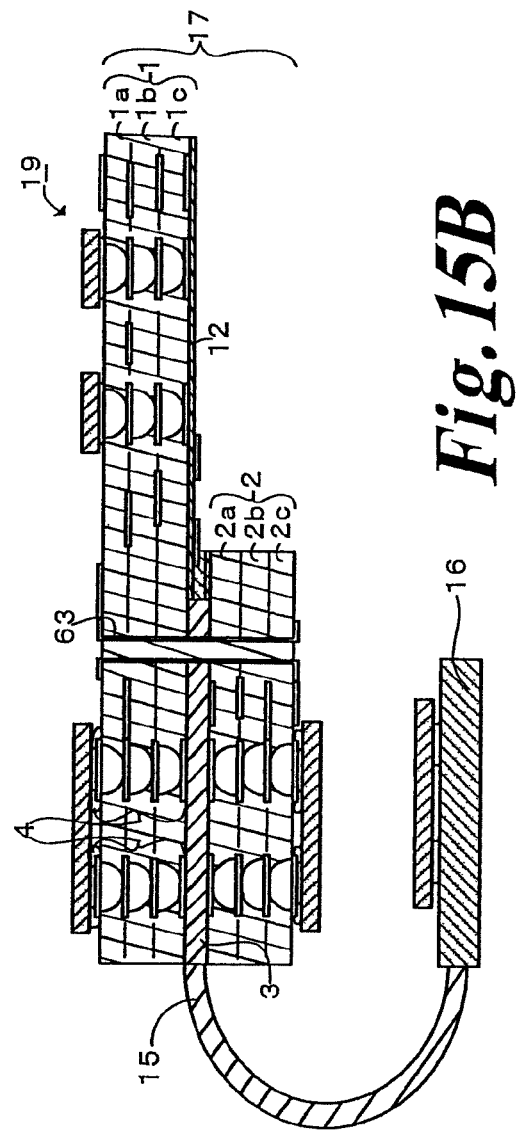
Fig. 15A
Fig. 15B

METHOD OF MANUFACTURING WIRING BOARD

CROSS-REFERENCE TO RELATED APPLICATIONS

This application is a divisional of and claims the benefit of priority from U.S. Ser. No. 12/146,279, filed Jun. 25, 2008, now U.S. Pat. No. 8,178,789 which claims the benefit of priority from U.S. Provisional application Ser. No. 60/950,229, filed Jul. 17, 2007. The entire contents of those applications are incorporated herein by reference.

TECHNICAL FIELD

The present invention relates to a wiring board formed by combining at least two boards each having a different size mounting area, and a method of manufacturing such a wiring board.

DESCRIPTION OF RELATED ART

Japanese Laid-Open Patent Publication H5-152693 discloses technology to solve the problem of insufficient rigidity of a wiring board. The technology relates to a wiring board having a reinforced section formed by making an extended portion of a flexible substrate and folding the extended portion.

In the meantime, to increase the number of mounting components, a wiring board having a flexible substrate and a multilayered built-up substrate has been developed. A flexible substrate is pliable and thin, thus the space it occupies in a wiring board may be small. In addition, a flexible substrate is often used in an electronic device whose casing is occasionally bent. Also, a multilayered built-up substrate may be highly integrated, thus the space it occupies in a wiring board may be made small.

However, when manufacturing a wiring board having a flexible substrate and a multilayered built-up substrate, in a step to form a conductive pattern on an outer layer of the built-up substrate, there are occasions when the etching resist is poorly formed. Therefore, in Japanese Laid-Open Patent Publication 2006-216785, in a step to form a conductive pattern on an outer layer of the built-up substrate, technology to remove gaps between the flexible substrate and the built-up substrate is disclosed. The entire content of each of H5-152693 and 2006-216785 is incorporated herein by reference.

SUMMARY OF THE INVENTION

A wiring board assembly including a first wiring board having a first substrate, a non-pliable second substrate having a smaller mounting area than a mounting area of the first substrate and a base substrate laminated between the first substrate and the second substrate such that the first substrate extends beyond an edge of the second substrate. At least one via formed in at least one of the first substrate or the second substrate. A second wiring board includes a pliable member connecting the first wiring board to the second wiring board.

A method of manufacturing a wiring board including forming a first wiring board by at least forming a base substrate, forming a first insulation layer on a first surface of the base substrate and a second insulating layer on a second surface of the base substrate opposing the first surface at least one of which is a non-pliable insulation layer. Also included is forming at least one via in at least one of the insulation layers. The first insulating layer is cut in a first area and a second insulating layer is cut in a second area offset from the first area to form a first substrate laminated to a second substrate with the base layer interposed therebetween. The second substrate has a smaller mounting area than that of the first substrate such that the first substrate extends beyond an edge of the second substrate. Also included in the method is connecting a pliable member to the base substrate of the first wiring board, and connecting the pliable member to a second wiring board to thereby connect the first wiring board to the second wiring board.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1A is a side view illustrating a wiring board according to an embodiment of the present invention.

FIG. 1B is a plan view illustrating a wiring board according to an embodiment of the present invention.

FIG. 14A is a cross-sectional view of a wiring board according to an embodiment of the present invention.

FIG. 14B is a cross-sectional view of a wiring board according to an embodiment of the present invention.

FIG. 15A is a cross-sectional view of a wiring board according to an embodiment of the present invention.

FIG. 15B is a cross-sectional view of a wiring board according to an embodiment of the present invention.

DETAILED DESCRIPTION OF EMBODIMENTS

Figure 2:
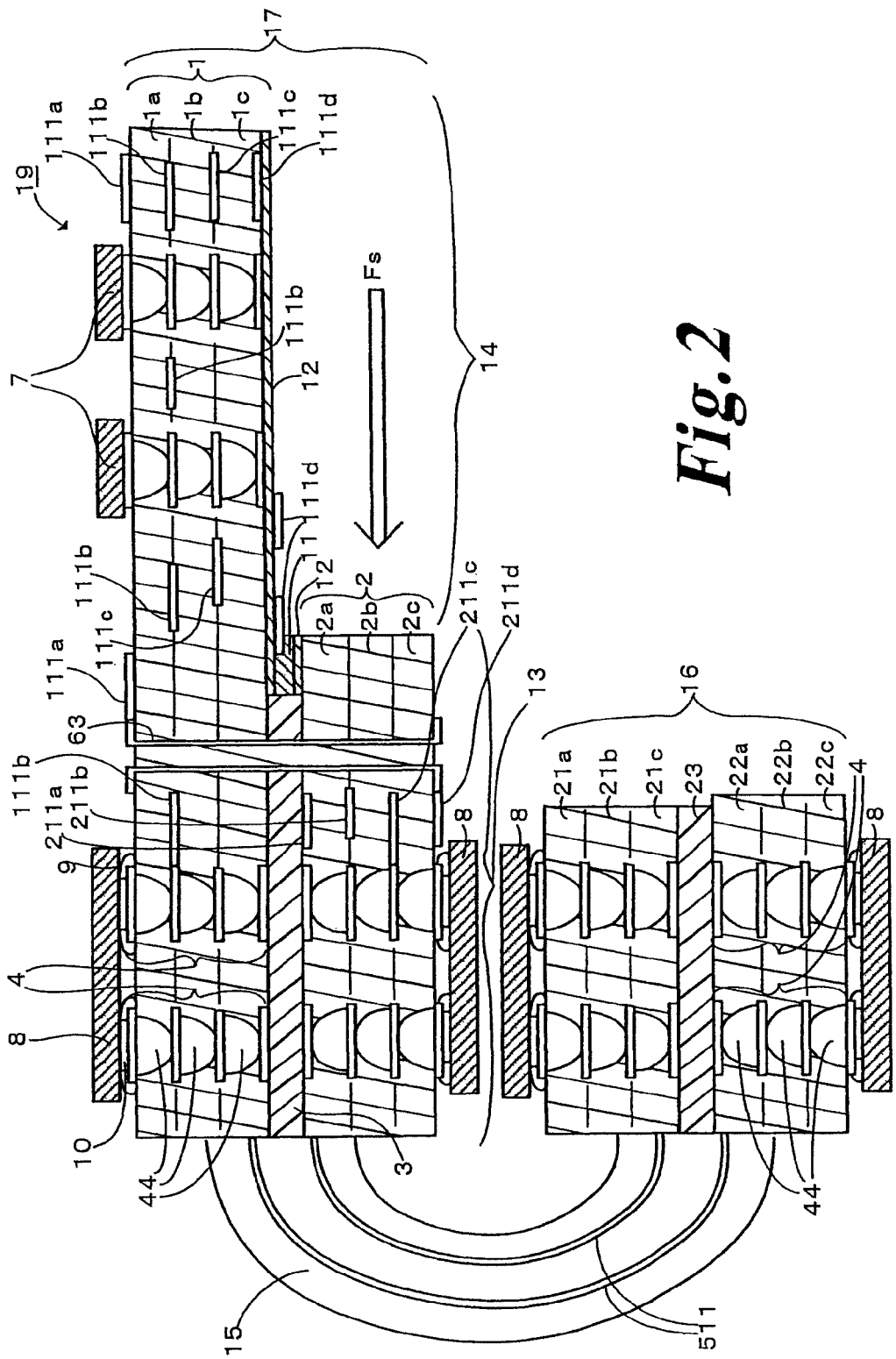
FIG. 2 is a cross-sectional view illustrating a wiring board according to an embodiment of the present invention.

In the following, an embodiment of a wiring board according to a specific example of the present invention is described with reference to the drawings.

As shown in FIG. 1A, wiring board 19 according to a specific example of the present invention is structured by connecting first wiring board 17 and second wiring board 16 with pliable member 15. In the embodiment of FIG. 1A, the pliable member is configured (e.g. length, flexibility etc.) such that the first wiring board 17 can be moved to a position opposing the second wiring board 16. Pliable member 15 is made of polyimide resin, for example. First wiring board 17 has a different thickness on one edge from a thickness on the other edge. The number of layers in the section having a different thickness (thicker section) differs from the number of layers in the thinner section. Namely, first wiring board 17 has thick multi-layer section 13 and relatively thin fewer-layer section 14. Multi-layer section 13 is formed by laminating two layers; first substrate 1 and second substrate 2. Fewer-layer section 14 has first substrate 1 which is extended from multi-layer section 13. Thus, as used herein, the term "multi-layer section" means two or more layers or boards, while the term "fewer layer section" means one or more layers or boards. Second wiring board 16 is structured by laminating third substrate 21 and fourth substrate 22.

As shown in FIGS. 1A and 1B, first substrate 1 and second substrate 2 have the same width and different lengths (i.e. substrate 2 has a smaller mounting area), and one end of first substrate 1 is aligned with one end of second substrate 2 such that another end of the first substrate extends beyond the second substrate. However, it is not necessary for any ends of the first and second substrates to be aligned, as will be discussed further below. In the embodiment of FIGS. 1A and 1B, first substrate 1 and second substrate 2 are each formed with non-pliable material such as epoxy resin. Third substrate 21 and fourth substrate 22 have the same width and same length, and one end of third substrate 21 and one end of fourth substrate 22 are aligned. Third substrate 21 and fourth substrate 22 are each formed with non-pliable material such as epoxy resin.

On the surfaces (mounting surfaces) of first substrate 1, second substrate 2, third substrate 21 and fourth substrate 22, connection pads to connect electronic components are formed; on the surfaces (mounting surfaces) and the interiors of first substrate 1, second substrate 2, third substrate 21 and fourth substrate 22, wiring patterns to structure electrical circuits are formed. On the mounting surfaces of first substrate 1 and second substrate 2, electronic components 7, 8 are arranged and connected to connection pads according to their requirements. Electronic components 7, 8 are connected with each other through connection pads and wiring patterns. Also, on the mounting surfaces of third substrate 21 and fourth substrate 22, electronic components 8 are arranged as well.

Wiring board 19 is placed, for example, in the casing of a cell phone device. In such a circumstance, electronic component 7 arranged on fewer-layer section 14 is structured, for example, with the keypad of a keyboard; and electronic components 8 arranged on multi-layer section 13, third substrate 21 and fourth substrate 22 are structured with an electronic chip, IC module, functional components and others, for example. Also, at the step portion formed by multi-layer section 13 and fewer-layer section 14, for example, a thin-type battery is placed.

Base substrate 3 is made of highly rigid material such as glass epoxy resin. Base substrate 3 is made 50-100 μm, preferably about 100 μm. Third substrate 21 and fourth substrate 22 are laminated via base member 23. Base member 23 is made of highly rigid material such as glass epoxy resin. Base member 23 is made 50-100 μm, preferably about 100 μm.

Next, a detailed structure of wiring board 19 having the above overall structure is described in reference to FIG. 2. As illustrated, first substrate 1 and second substrate 2 are laminated with base substrate 3 provided in between. One end (the left end as illustrated in the drawing) of base substrate 3 is made to be flush with first substrate 1 and second substrate 2. Thus, the base substrate 3 is laminated between the first substrate and the second substrate such that the first substrate 1 extends beyond an edge of the second substrate 2. Alternatively, only an almost middle region of the wiring board 19 can be a thick multilayer section while opposing ends of the wiring board are each a thinner fewer layer section. An example of the almost middle region is the area in FIG. 2 between one cross section line (not shown) through the edge of the second substrate which forms the step structure, and another cross section line (not shown) through an edge of components 8 which is closest to the through hole 63. Still alternatively, the first substrate 1 and second substrate 2 having the same width and different lengths can be arranged such that opposing ends of the first substrate 1 each extend beyond the second substrate 2 as shown in the examples in FIGS. 14A and 14B, which will be further discussed below.

However, it is not necessary to have any peripheral edges of the first and second substrate aligned. That is, the wiring board can have an entire peripheral region (for example, formed by the first substrate 1 alone or second substrate 2 alone) that is thinner than an interior non-peripheral region (for example, formed by the first and second substrates together). Thus, according to embodiments of the invention, at least a central portion of the wiring board is a thicker multi layer section, and at least a portion of the periphery of the wiring board is a thinner fewer layer section. As used herein "central portion" means a non-peripheral area of the wiring board having a thicker multilayer section, but does not mean the geometric center of the wiring board.

Base substrate 3 is made of highly rigid material such as glass epoxy resin. Base substrate 3 is made 50-100 µm, preferably about 100 µm. Third substrate 21 and fourth substrate 22 are laminated via base member 23. Base member 23 is made of highly rigid material such as glass epoxy resin. Base member 23 is made 50-100 µm, preferably about 100 µm.

Base substrate 3 is formed to be shorter than second substrate 2, and between first substrate 1 and second substrate 2, groove (hereinafter referred to as "interlayer groove section") 11 is formed. Interlayer groove section 11 is an aperture. The groove may be filled with elastic material or viscous material such as silicone gel or silicone oil. When wiring board 19 receives an impact from being dropped, the groove aperture or silicone gel or silicone oil that is filled in the interior of the groove cushions the impact as a shock-absorbing layer. Therefore, by being structured as such, tolerance to impact from being dropped may be improved.

First substrate 1 has a structure of laminated multiple insulation layers (1a, 1b, 1c). Each insulation layer is made of epoxy resin or the like with a thickness of approximately 10 µm-60 µm. On the upper surface of insulation layer 1a, between epoxy-resin layers 1a and 1b, between insulation layers 1b and 1c and on the lower surface of insulation layer 1c, wiring patterns (111a, 111b, 111c, 111d) are formed respectively. Each wiring pattern (111a, 111b, 111c, 111d) electrically connects required portions inside the circuit substrate.

Second substrate 2 also has a structure of laminated multiple insulation layers (2a, 2b, 2c) made of epoxy resin or the like with a thickness of approximately 10 µm-60 µm. On the lower surface of insulation layer 2a, between epoxy-resin layers 2a and 2b, between insulation layers 2b and 2c and on the upper surface of insulation layer 2c, wiring patterns (211a, 211b, 211c, 211d) are formed respectively. Each wiring pattern (211a, 211b, 211c, 211d) electrically connects required portions inside the circuit substrate.

On the exposed portion of the lower surface of first substrate 1 and the exposed portion of the upper surface of the second substrate, adhesion prevention layers 12 as a protective insulation layer are formed. At the step portion formed when laminating first substrate 1 and second substrate 2, conductive pattern 111d is formed. Also, to the right of conductive pattern 111d formed at the step portion, conductive pattern 111d is formed as well. On the surface of pliable member 15 that connects first wiring board 17 and second wiring board 16, conductive pattern 511 is formed. Conductive pattern 511 connects the wiring pattern of first substrate 1 and the wiring pattern of the second substrate 2 according to their requirements.

Third substrate 21 has a structure of laminated multiple insulation layers (21a, 21b, 21c). Also, fourth substrate 22 has a structure of laminated multiple insulation layers (22a, 22b, 22c). Each insulation layer is made of epoxy resin or the like with a thickness approximately 10 µm-60 µm.

Keypad 7 is arranged on the conductive pattern formed on the surface of fewer-layer section 14. Further, using solder 9, electronic chip 8 is anchored and connected to wiring patterns and built-up vias 4 through connection pads 10. For solder 9, Sn/Ag/Cu was used.

Moreover, through-hole 63 is formed, penetrating base substrate 3, further penetrating first substrate 1 and second substrate 2, and connecting wiring pattern 111a of first substrate 1 and wiring pattern 211d of second substrate 2. The inner surface of through-hole 63 is plated so as to electrically connect wiring patterns. The area enveloped by plated through-hole 63 may be filled with resin such as epoxy-resin.

The term "through-hole" refers to an electrical connection between conductors using a hole or aperture. In general, a through-hole may be referred to as a platted through-hole. A through-hole can provide a conductive connection between a conductor formed on one end of the through-hole to a conductor formed on the other end of the through-hole. For example, a through-hole can provide a conductive connection between outer layers of a multi-layer printed circuit board and/or may provide conductive connection to or between inner circuits of a multilayer printed circuit board. In forming a through-hole, a penetrating hole is first formed by drilling, and a conductor is formed in the penetrating hole by metal plating (such as copper plating). In addition to providing electrical connection as noted above, a through-hole can receive the terminal of an electronic part for insertion mounting and fixing the electronic part to a printed circuit board.

Figure 3:
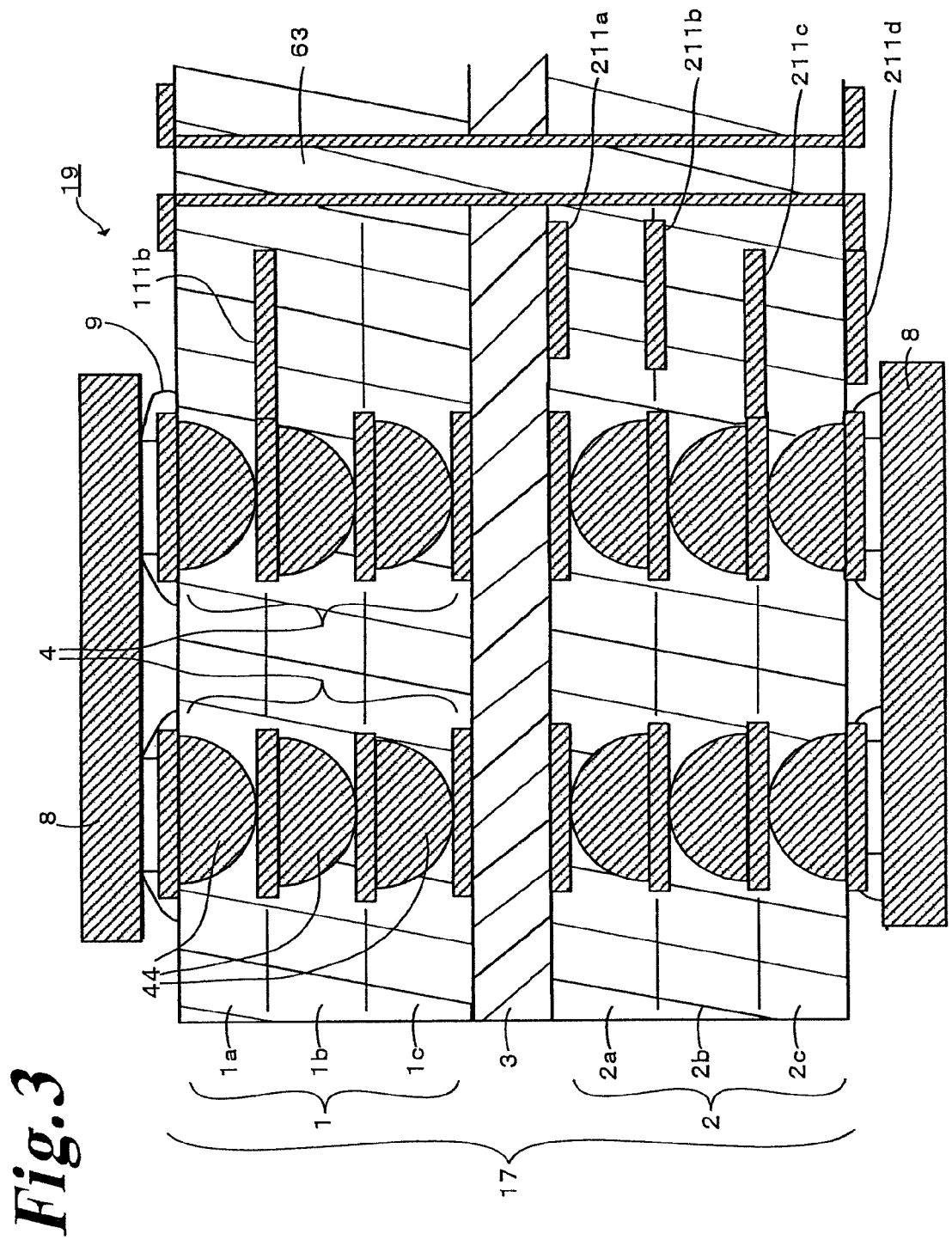
FIG. 3 is a cross-sectional view illustrating a wiring board according to an embodiment of the present invention.
Figure 4:
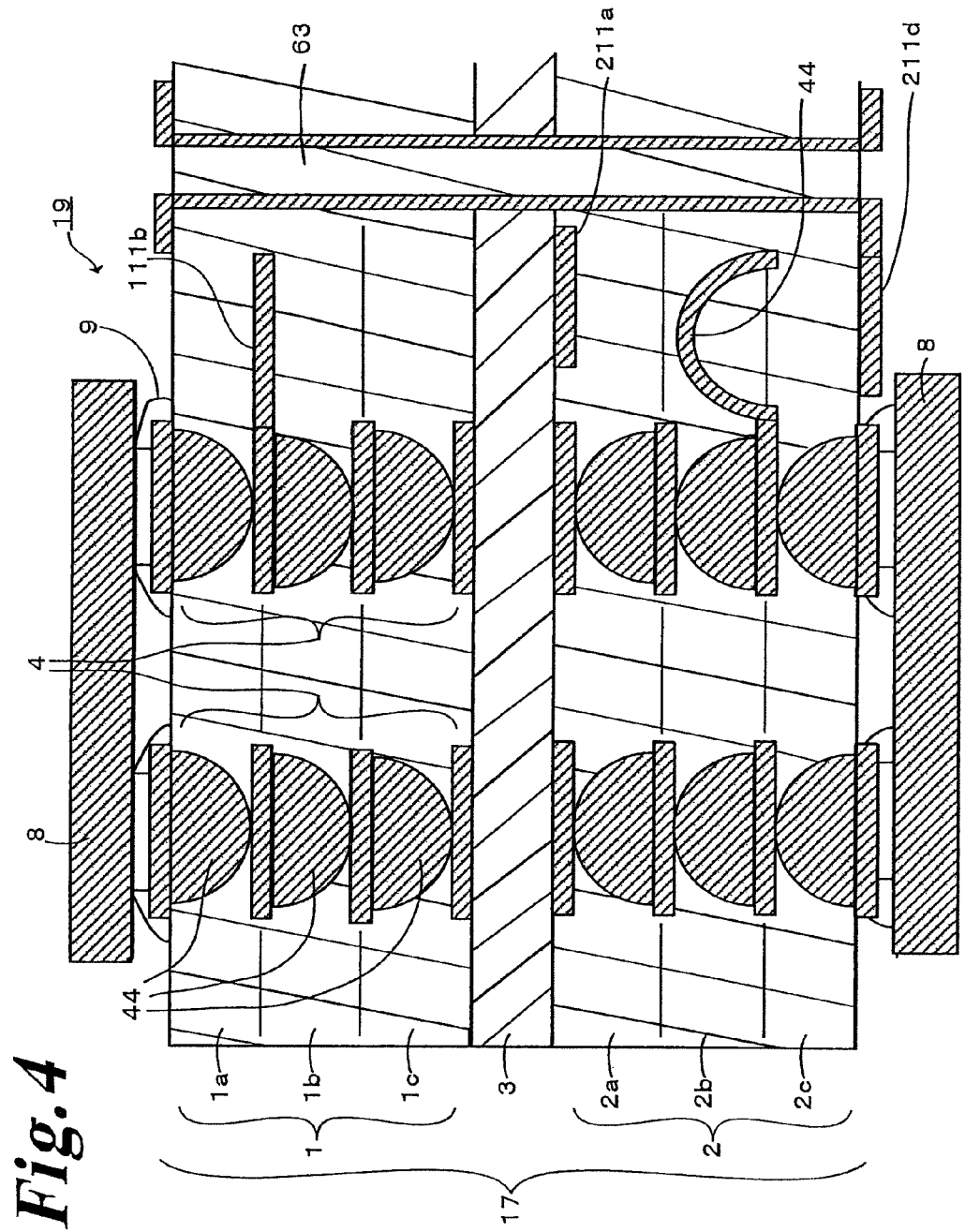
FIG. 4 is a cross-sectional view illustrating a wiring board according to an embodiment of the present invention.

In first substrate 1, second substrate 2, third substrate 21 and fourth substrate 22, multiple built-up vias 4 are formed. Built-up vias 4 are structured by stacking vias 44 formed in each insulation layer (1a-1c, 2a-2c, 21a-21c, 22a-22c). Built-up vias 4 connect required portions of wiring patterns (111a-111d) and also connect required portions of wiring patterns (211a-211d). On the inner surface of each via 44 forming built-up vias 4, a conductive layer made of plated copper or the like is formed. As shown in FIG. 3, the interior of each via 44 is filled with conductor such as copper. As shown in FIG. 4, the interior of via 44 may also be filled with resin such as epoxy-resin. Thus, the term "via" as used herein means an opening formed in a substrate such as an insulating layer.

Wiring board 19 having the above structure, for example, transmits operational signals from keypad 7 to an IC chip through built-up vias 4, wiring patterns (111a-111d) and through-hole 63, and the signals are then processed at the IC chip. By doing so, varieties of signal processing may be conducted.

Also, as described above, wiring board 19 is structured with multi-layer section 13 and fewer-layer section 14 and has a step portion. And at the lower portion of fewer-layer section 14, a large-volume component such as a cell-phone battery may be placed.

In the embodiment of FIG. 2, base substrate 3 is formed with highly rigid material such as glass-epoxy resin. Multi-layer section 13, because of base substrate 3 placed there, is highly rigid compared with fewer-layer section 14. On the other hand, fewer-layer section 14 is relatively flexible compared with multi-layer section 13. Therefore, it is possible to place electronic components on either sections 13 or 14 according to the reliability level they require when being placed.

Figure 5:
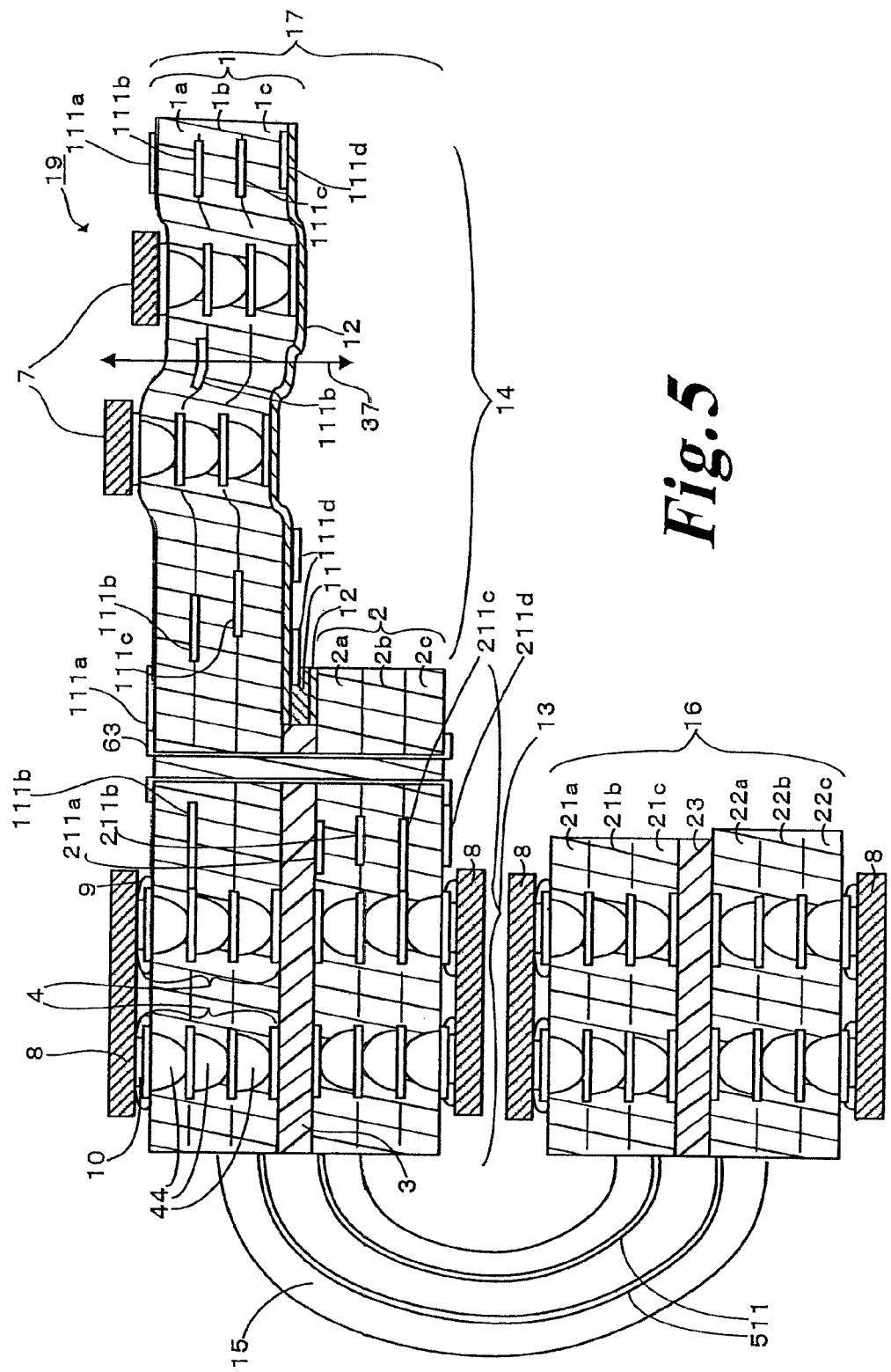
FIG. 5 is a cross-sectional view illustrating a wiring board according to an embodiment of the present invention.

Also, for example, when the electronic device is dropped and an impact or the like is exerted on wiring board 19, due to the relative flexibility of fewer-layer section 14 compared with multi-layer section 13, as shown by arrow 37 in FIG. 5, fewer-layer section 14 vibrates. Since portions of fewer-layer section 14 vibrate, the impact from being dropped or the like is converted to vibration motion energy, and the impact is absorbed accordingly. As a result, the risk of rupture in the wiring that connects the electronic components mounted on wiring board 19 may be minimized.

Also, built-up via 4 has a stacked via structure with laminated multiple vias 44. By making such a stacked interlayer connection structure, the wiring length is shortened, and thus preferable for mounting electronic components requiring large amounts of electricity.

Figure 6:
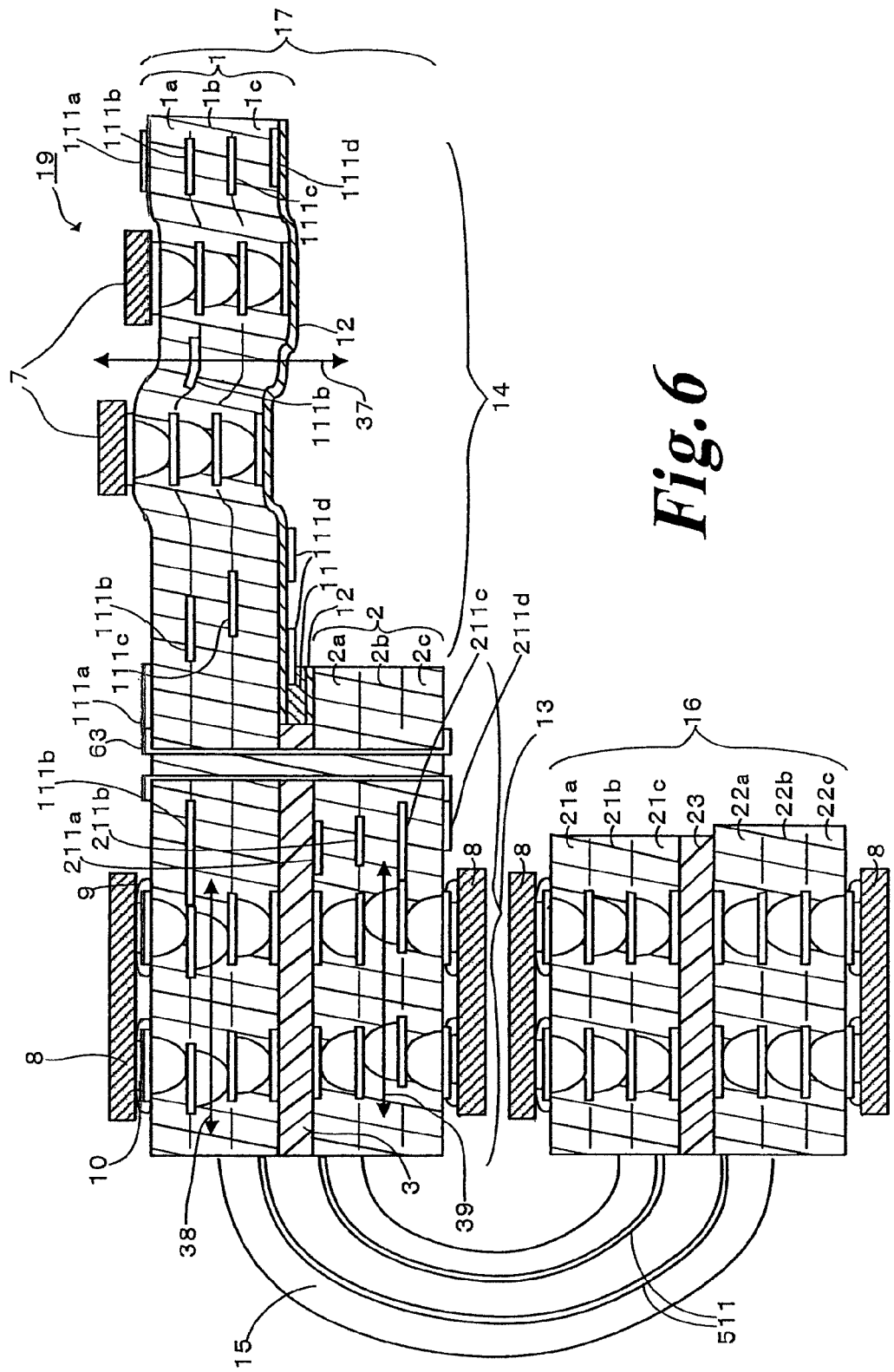
FIG. 6 is a cross-sectional view illustrating a wiring board according to an embodiment of the present invention.

Moreover, built-up via 4 has a certain degree of mobility. Therefore, for example, when the electronic device is dropped and an impact is exerted on wiring board 19, as shown by arrows 38, 39 in FIG. 6, through the movement of built-up via 4, the impact may be absorbed at built-up via 4. As a result, the risk of rupture in the wiring that connects the electronic components mounted on wiring board 19 may be minimized.

In addition, through-hole 63, which penetrates base substrate 3, is formed, and the inner surface of through-hole 63 is plated (or filled with resin). Thus, as shown in FIG. 2, if shearing force (Fs) is exerted on the wiring board from a horizontal direction, through-hole 63 may counter the shearing force, thus preventing first substrate 1 and second substrate 2 from sliding.

Further, if solid material or the like is filled in interlayer groove section 11, when the impact from being dropped or the like is exerted on the wiring board, interlayer groove section 11 cushions the impact as a shock-absorbing layer. Accordingly, when interlayer groove section 11 is formed, by improving tolerance to impact from being dropped, the risk of rupture in the wiring that connects the electronic components mounted on the wiring board may be minimized.

Furthermore, in addition to first wiring board 17, second wiring board 16 is formed, thus additional multiple electronic components may be mounted on second substrate 17. Accordingly, an increase in the number of mounted electronic components is achieved.

Also, in certain circumstances, two wiring boards of the present invention may be combined and sold in such a way that each fewer-layer section 14 is closely placed. Here, if a wiring pattern is formed at the step portion created when first substrate 1 and second substrate 2 are laminated, in a circumstance when a user (such as a device manufacturer) uses the combined wiring boards of the present invention separately, warping of the wiring boards may be prevented. Namely, multi-layer section 13, because of base substrate 3 placed there, is rigid compared with fewer-layer section 14. Thus, when a user uses the combined wiring boards of the present invention separately, warping does not occur at multi-layer section 13. On the other hand, fewer-layer section 14 is flexible compared with multi-layer section 13. Thus, when a user uses the combined wiring boards of the present invention separately, warping could possibly occur at fewer-layer section 14, especially at the step portion of fewer-layer section 14 created when first substrate 1 and second substrate 2 are laminated. However, if a wiring pattern is formed at the step portion, in a circumstance when a user or the like uses the combined wiring boards of the present invention separately, warping may be prevented.

In the following, a method of manufacturing wiring board 19 according to the present invention is described.

Figure 7A:
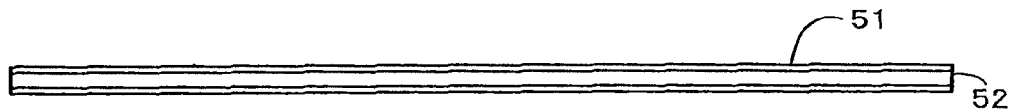
FIG. 7A illustrates a step of a method to manufacture a wiring board according to an embodiment of the present invention.

First, as shown in FIG. 7A, dummy core 52, which will form adhesion prevention layer 12, is prepared. Dummy core 52 is formed, for example, with a C-stage epoxy-resin. On dummy core 52, copper foil 51 is deposited.

Figure 7B:
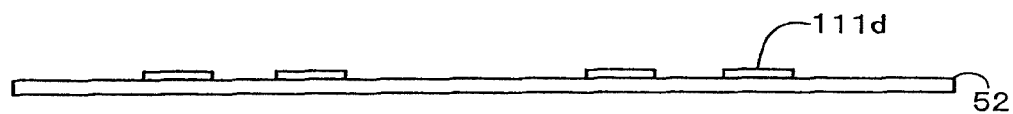
FIG. 7B illustrates a step of a method to manufacture a wiring board according to an embodiment of the present invention.

Next, as shown in FIG. 7B, by patterning copper foil 51, conductive pattern 111d is formed at a predetermined position.

Figure 7C:
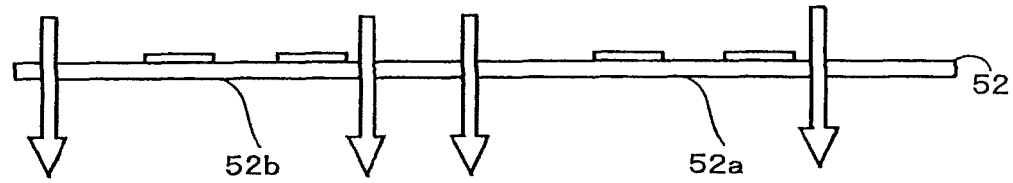
FIG. 7C illustrates a step of a method to manufacture a wiring board according to an embodiment of the present invention.

Next, as shown by arrows in FIG. 7C, dummy core 52 is cut by a laser or the like, as represented by the arrows to adjust its length to a length preferred for use in wiring board 19.

Figure 7D:
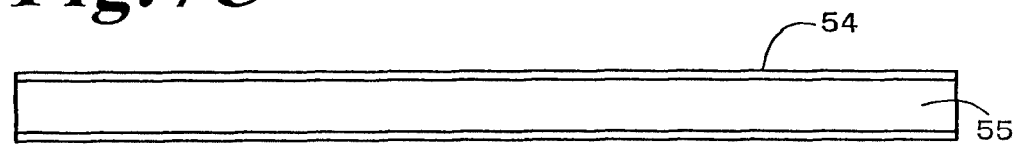
FIG. 7D illustrates a step of a method to manufacture a wiring board according to an embodiment of the present invention.

Meanwhile, as shown in FIG. 7D, core 55, which will function as base substrate 3, is prepared. Core 55 is made, for example, of highly rigid material such as glass-epoxy resin. On both surfaces of core 55, copper foil 54 is deposited.

Figure 7E:
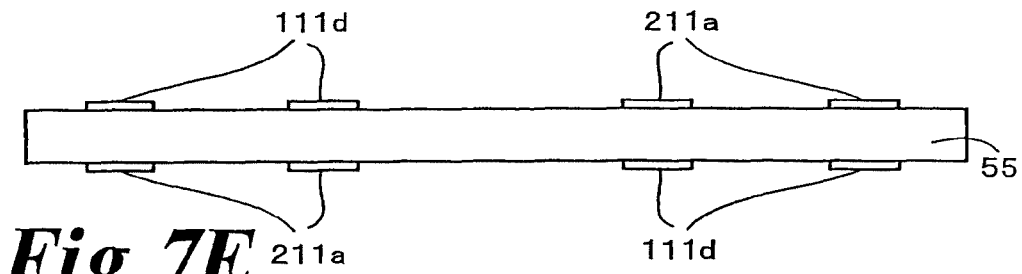
FIG. 7E illustrates a step of a method to manufacture a wiring board according to an embodiment of the present invention.

Next, as shown in FIG. 7E, by patterning copper foil 54, conductive patterns (111d, 211a) are formed to structure wiring patterns.

Figure 7F:
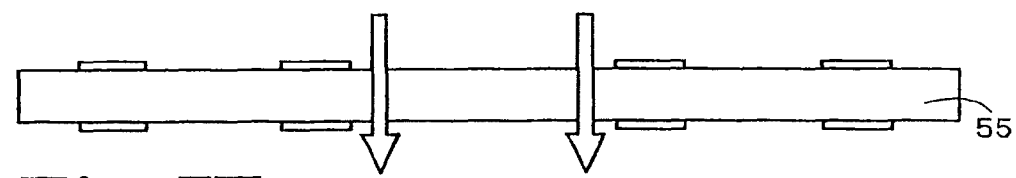
FIG. 7F illustrates a step of a method to manufacture a wiring board according to an embodiment of the present invention.

Next, as shown by arrows in FIG. 7F, in core 55 using a laser or the like as represented by the arrows in FIG. 7F, a hole to insert dummy core 52 is formed.

Figure 7G:
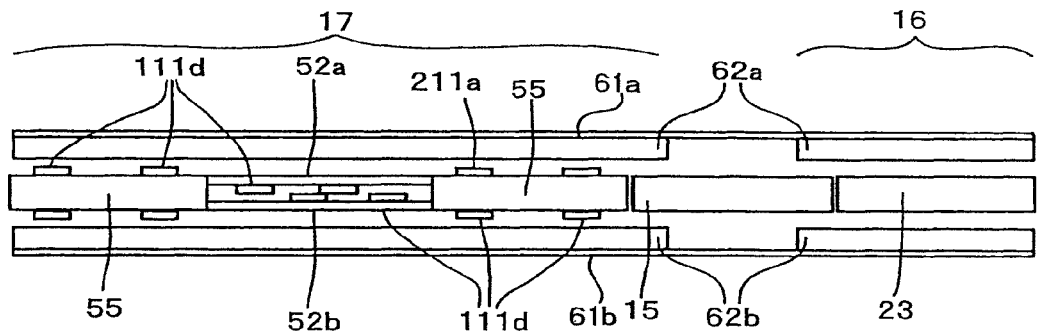
FIG. 7G illustrates a step of a method to manufacture a wiring board according to an embodiment of the present invention.

Next, as shown in FIG. 7G, cut-out dummy cores (52a, 52b) are arranged in such a way that conductive patterns 111d are laminated facing inward. Then, laminated dummy cores (52a, 52b) and cut core 55 are horizontally connected. Further, core 55 and base member 23 are connected via pliable member 15. Pliable member 15 is arranged so as to connect first wiring board 17 and second wiring board 16. Base member 23 is placed adjacent to and on the right of core 55 as shown in the drawing, but another base member 23 may also be placed adjacent to and on the left of core 55 (not shown in the drawing).

Next, on the top and bottom of dummy cores (52a, 52b), core 55 and base member 23, prepreg (62a, 62b) are laminated. For prepreg (62a, 62b), low-flow prepreg impregnated with low-flow epoxy-resin is preferred. Then, on the surfaces of prepreg (62a, 62b), copper foils (61a, 61b) are deposited.

Figure 7H:
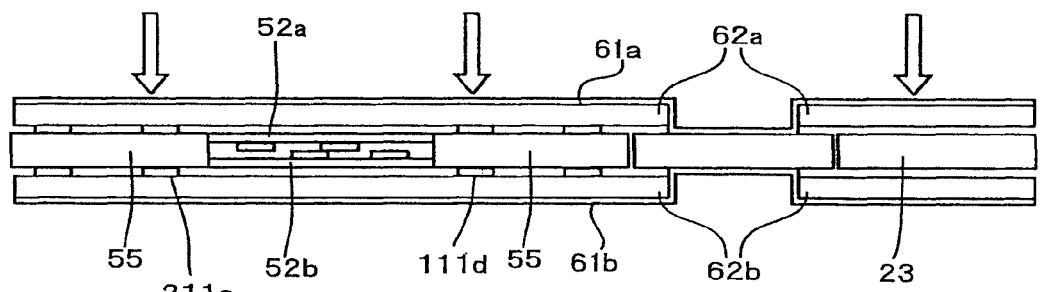
FIG. 7H illustrates a step of a method to manufacture a wiring board according to an embodiment of the present invention.

Next, as shown by the arrows in FIG. 7H, pressure is applied on the laminate shown in FIG. 7G, which causes, among other things, copper foils 61a, 61b to conform to the pliable member. Pressure is applied, for example, by hydraulic power using hydraulic pressing equipment under conditions calling for temperature of 200° C., pressure of 40 kgf and pressing time of three (3) hours. By doing so, resin is squeezed out from the prepreg, and the prepreg and core material will be integrated accordingly. At this time, since dummy core 52 is made of a C-stage epoxy-resin, the materials in dummy core 52 are not integrated with each other. For applying pressure, vacuum pressing may be employed instead of hydraulic pressing. By conducting vacuum pressing, bubbles may be kept from mixing into the resin which structures the insulation layers. Vacuum pressing is conducted, for example, for an hour. Peak heating temperature is set, for example, at 175° C. and vacuum-pressing pressure is set, for example, at $3.90 \times 10^6$ [Pa].

Figure 7I:
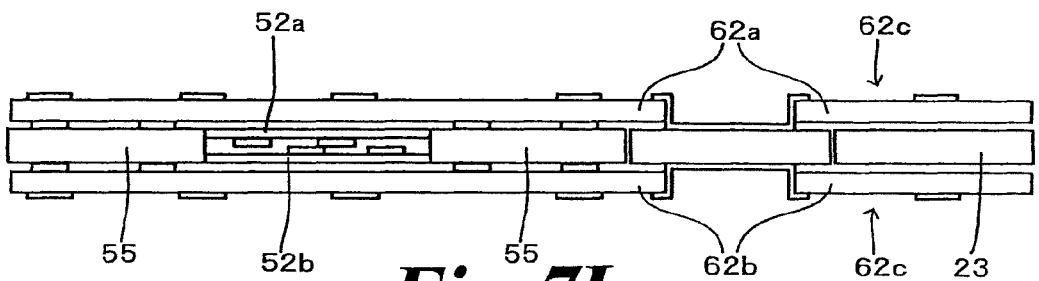
FIG. 7I illustrates a step of a method to manufacture a wiring board according to an embodiment of the present invention.

Next, as shown in FIG. 7I, by removing the unnecessary portions of copper foil 61 from the laminate shown in FIG. 7H, wiring patterns 62c are formed.

Figure 7J:
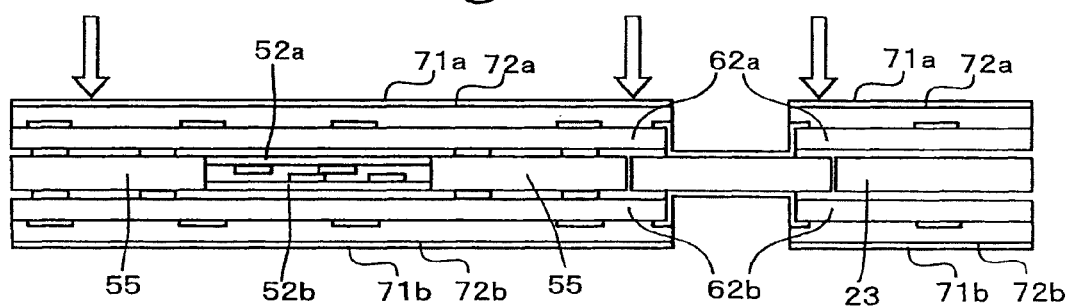
FIG. 7J illustrates a step of a method to manufacture a wiring board according to an embodiment of the present invention.

Next, as shown in FIG. 7J, epoxy resin 72 is further laminated to form inner layers. On both surfaces of epoxy resin 72, copper foil 71 is deposited. Then, pressure is applied as represented by the arrows. Pressure may be applied, for example, by hydraulic power using hydraulic pressing equipment, or by vacuum pressing.

Figure 7K:
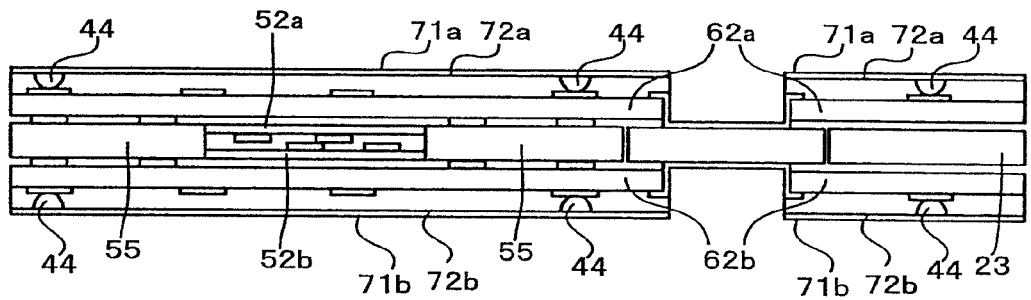
FIG. 7K illustrates a step of a method to manufacture a wiring board according to an embodiment of the present invention.

Then, as shown in FIG. 7K, vias 44 are formed. Namely, in epoxy resin (72a, 72b) made of insulation resin, openings for via-holes are formed. Those openings may be formed by a laser beam. Then, to remove resin residue remaining on the side and bottom surfaces of the openings formed by laser beam, a desmear treatment is performed. The desmear treatment is performed by an oxygen plasma discharge treatment, a corona discharge treatment, an ultra-violet laser treatment or an exima laser treatment, for example. In the openings formed by a laser, conductive material is filled to form filled via holes. As for the conductive material, conductive paste or metal plating formed by an electrolytic plating process is preferred. For example, vias 44 are filled with conductor such as copper plating. To reduce the manufacturing cost and improve productivity by simplifying the filled-via forming step, filling with a conductive paste is preferred. For example, a conductive paste (such as thermo-set resin containing conductive particles) may be printed by screen-printing, filled in vias 44 and cured. By filling the interiors of vias 44 with the same conductive paste material, connection reliability when thermo-stress is exerted on vias 44 may be improved. On the other hand, regarding connection reliability, metal plating formed by an electrolytic plating process is preferred. Especially, electrolytic copper plating is preferred.

Figure 7L:
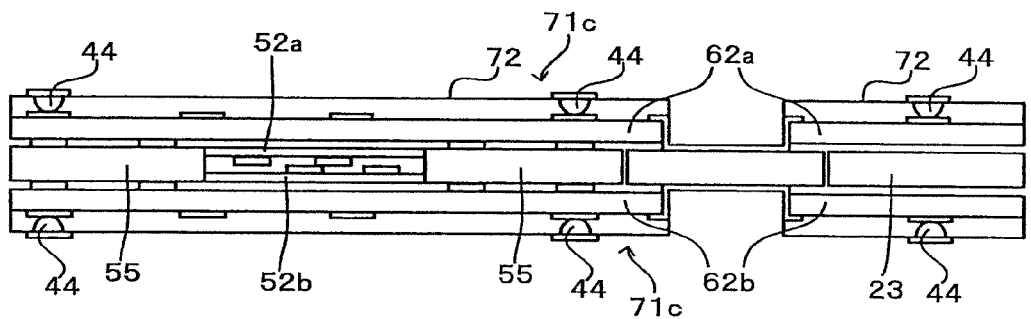
FIG. 7L illustrates a step of a method to manufacture a wiring board according to an embodiment of the present invention.

Next, as shown in FIG. 7L, by removing the unnecessary portions of copper foil 71, inner-layer patterns 71c are formed.

Figure 7M:
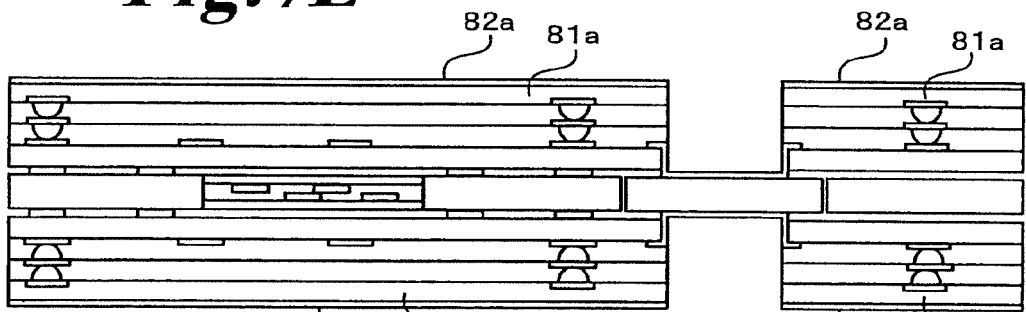
FIG. 7M illustrates a step of a method to manufacture a wiring board according to an embodiment of the present invention.

Next, as shown in FIG. 7M, after inner layers and vias are further formed, epoxy-resin 81 is laminated to form outer layers. On both surfaces of epoxy-resin 81, copper foil (82a, 82b) is deposited. Here, a copper foil sheet containing resin (Resin Cupper Film: RCF) may be placed and pressed.

Figure 7N:
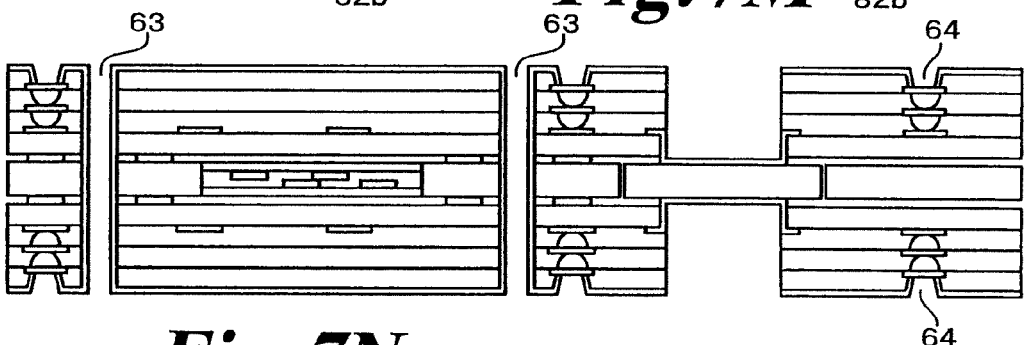
FIG. 7N illustrates a step of a method to manufacture a wiring board according to an embodiment of the present invention.

Next, as shown in FIG. 7N, vias 64 are formed in the RCF. Further, in the laminate shown in FIG. 7M, holes are opened by a drill. The holes penetrate the base substrate and insulation layers formed on both sides of the base substrate. By doing so, through-holes 63 are formed. Then, using copper plating or the like, the interiors of the vias and through-holes 63 are filled with conductor. Also, according to requirements, by patterning the surface of the copper foil, conductive patterns are formed as shown in FIG. 7O.

Figure 7O:
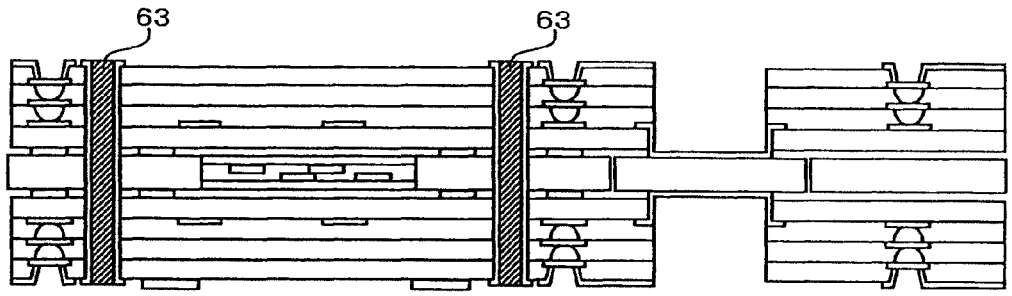
FIG. 7O illustrates a step of a method to manufacture a wiring board according to an embodiment of the present invention.

Next, as shown in FIG. 7O, the interiors of through-holes 63 are filled with epoxy resin. Then, by removing unnecessary portions of copper foils 82, outer-layer patterns are formed.

Figure 7P:
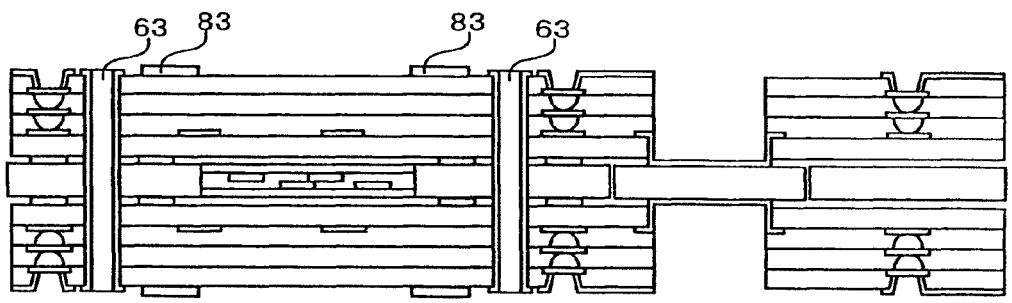
FIG. 7P illustrates a step of a method to manufacture a wiring board according to an embodiment of the present invention.

Next, as shown in FIG. 7P, solder resist 83 is formed. Here, the solder resist indicates heat-resistant coating material, which is used when applying solder to cover the portions to keep the solder from adhering. For solder-resist varieties, photo-setting-type solder resist and thermo-setting-type solder resist may be used. For a coating method, a screen-printing method or curtain-coating method may be used.

Figure 7Q:
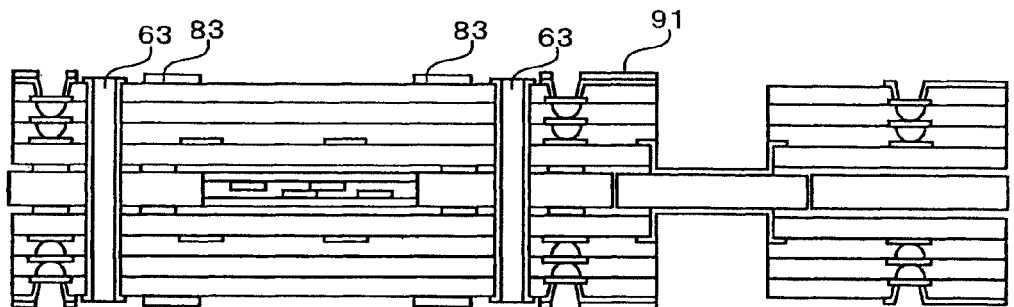
FIG. 7Q illustrates a step of a method to manufacture a wiring board according to an embodiment of the present invention.

Next, as shown in FIG. 7Q, to protect outer-layer patterns, gold plating 91 is performed by chemical plating. Other than chemical plating, methods such as fusion plating and electrical plating may be used. Moreover, other than gold plating, alloy plating may be used.

Figure 7R:
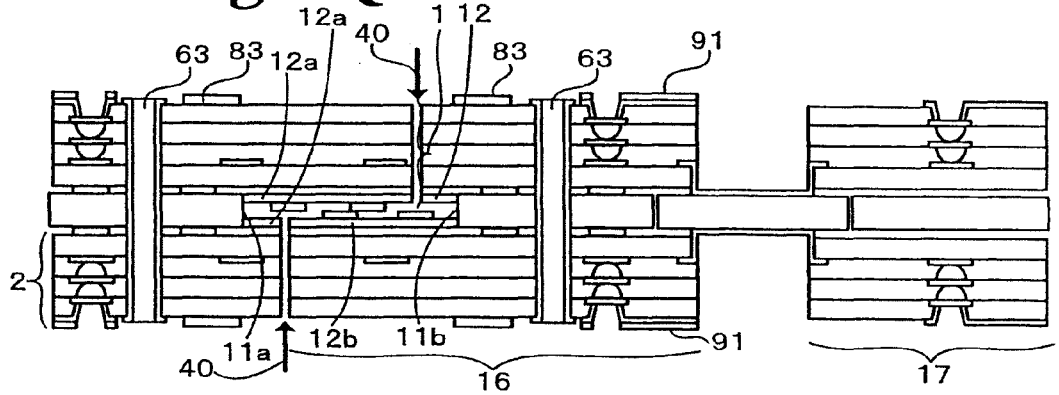
FIG. 7R illustrates a step of a method to manufacture a wiring board according to an embodiment of the present invention.

Next, as shown by arrows 40 in FIG. 7R, laser beams from laser processing equipment, for example $CO_2$ laser, are beamed using conductive patterns 111d as a stopper when cutting insulation layers and the copper foil sheet containing resin (RCF). Here, the thickness of conductive patterns 111d is preferred to be made approximately 5-10 µm: If too thin, a laser beam may penetrate the pattern; and if too thick, conductive circuit patterns with a fine line width are difficult to form.

Meanwhile, by laser cutting as shown in FIG. 7R, interlayer groove sections (11a, 11b) are also formed. Namely, by laser cutting, using adhesion prevention layer 12a formed in first substrate 1 and adhesion prevention layer 12a formed in second substrate 2 as side-walls of the groove, and one surface of base substrate 3 as the bottom surface of the groove, interlayer groove sections (11a, 11b) are formed.

Figure 7S:
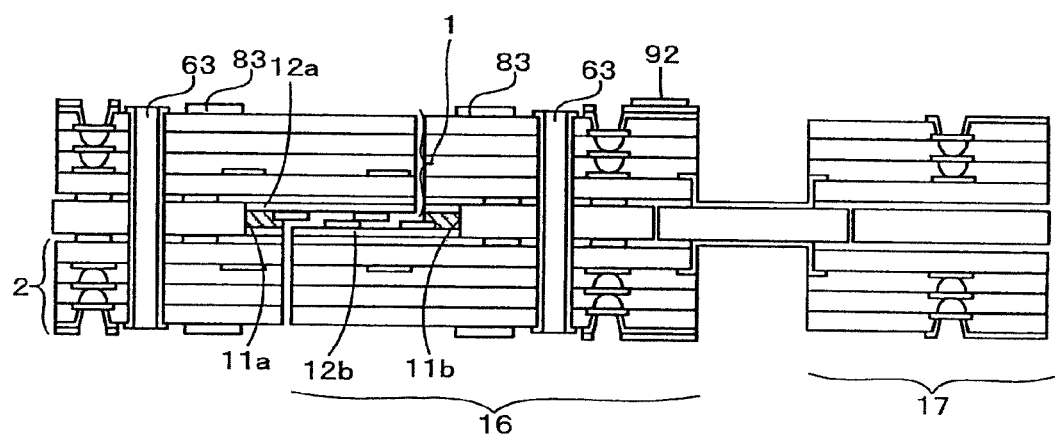
FIG. 7S illustrates a step of a method to manufacture a wiring board according to an embodiment of the present invention.

Lastly, as shown in FIG. 7S, electronic components 92 are mounted. Electronic components 92 are electronic chip 8 and keypad 7, for example. Further, interlayer groove sections (11a, 11b) may be filled with elastic material or viscous material as shown by the shaded area in FIG. 7S.

Figure 7T:
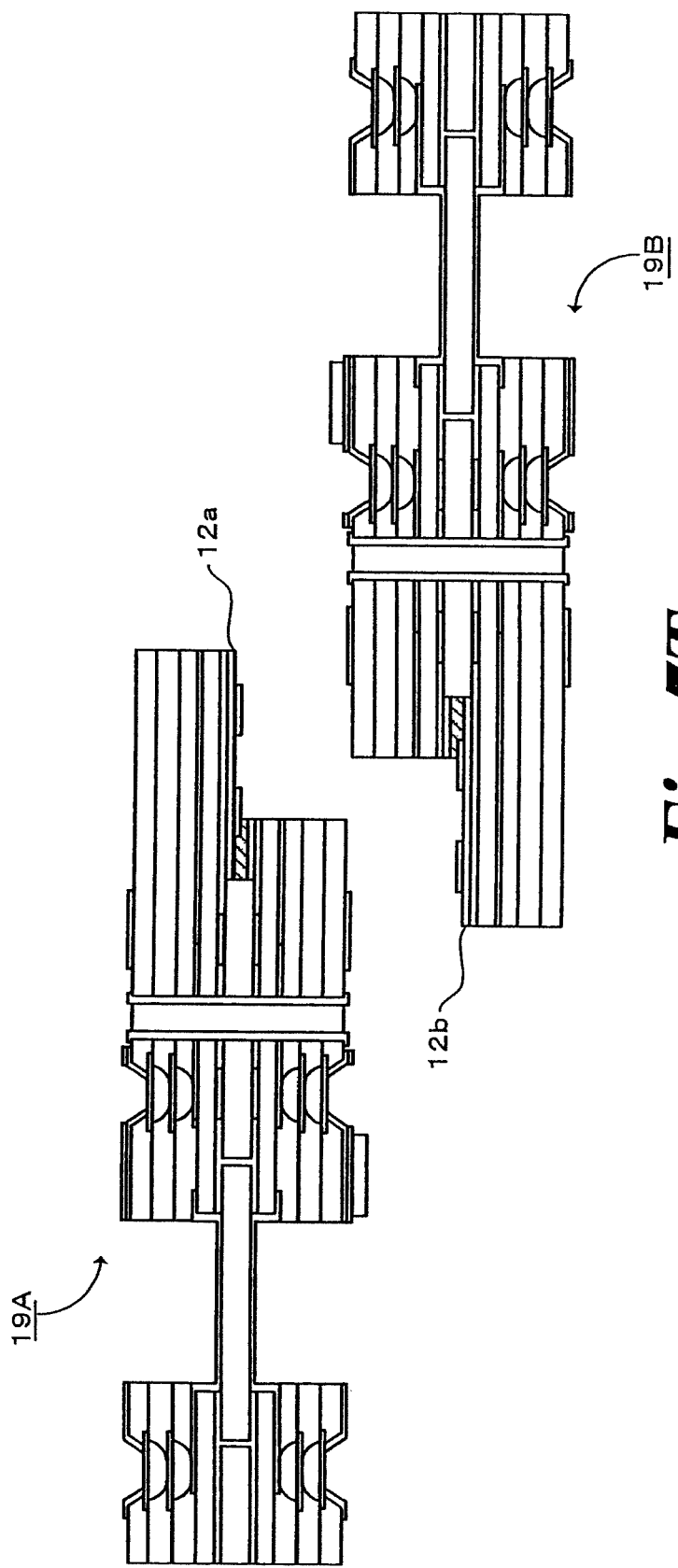
FIG. 7T is a view illustrating wiring boards according to an embodiment of the present invention.

Further, as shown in FIG. 7T, wiring board 19A and wiring board 19B are used separately. In such a circumstance, since adhesion prevention layers (12a, 12b) are formed, wiring board 19A and wiring board 19B may be separated by a simple process to be used separately. Regarding a wiring board according to the present invention, when an electronic device such as a cell phone receives an impact from being dropped or the like, ruptured connections among electronic components or the like mounted in the wiring board may be prevented. Also, when being shipped to a user, the wiring board can be handled compactly, and when being used by the user, the combined wiring boards can be separated easily.

Figure 8:
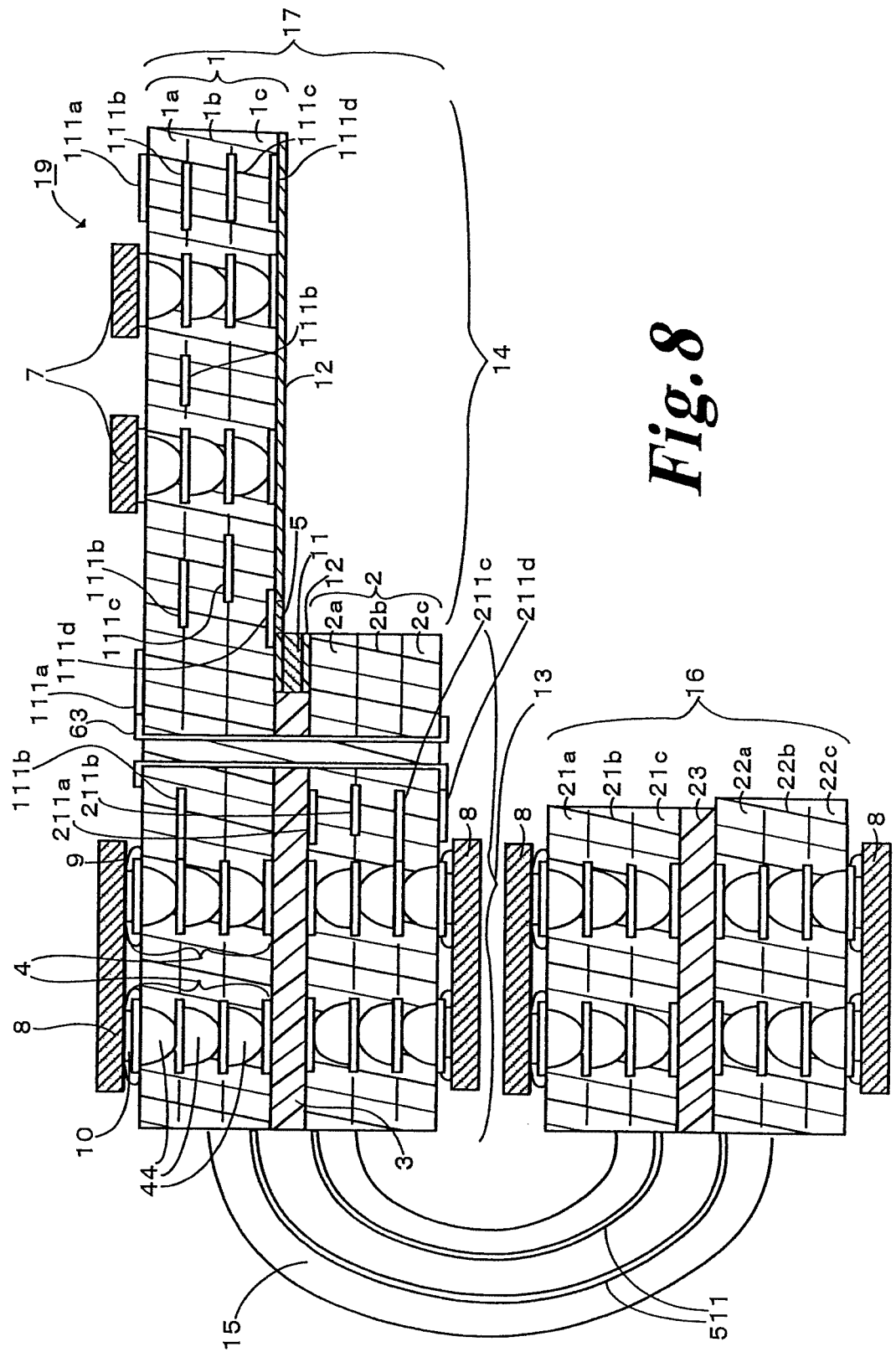
FIG. 8 is a cross-sectional view of a wiring board according to an embodiment of the present invention.

As shown in FIG. 8, according to another embodiment, at the portion where adhesion prevention layer 12 is made flush with the edge of second substrate 2, opening 5 is formed. The rest of the structure is the substantially the same as in the embodiment of FIG. 2. Under opening 5, part of wiring pattern 111d is positioned. Inside the groove, which is structured with opening 5 and wiring pattern 111d placed underneath, is an aperture. The groove may be filled with elastic material or viscous material such as silicone gel or silicone oil. When wiring board 19 receives an impact from being dropped, the aperture inside the groove or silicone gel or silicone oil filled in the groove cushions the impact as a shock-absorbing layer. Therefore, by making such a structure, tolerance to impact from being dropped may be improved.

Also, if solid material or the like is filled in opening 5, the filled solid material or the like may play a role in decreasing warping at the juncture of multi-layer section 13 and fewer-layer section 14 where the number of layers is reduced. Accordingly, at the juncture of multi-layer section 13 and fewer-layer section 14, cracks may be prevented. Furthermore, if opening 5 is filled, for example, with solid material such as resin, the filled solid material plays a role in protecting conductive pattern 111d mounted on first substrate 1. Therefore, tolerance to corrosion on conductive pattern 111d may be improved.

Figure 9A:
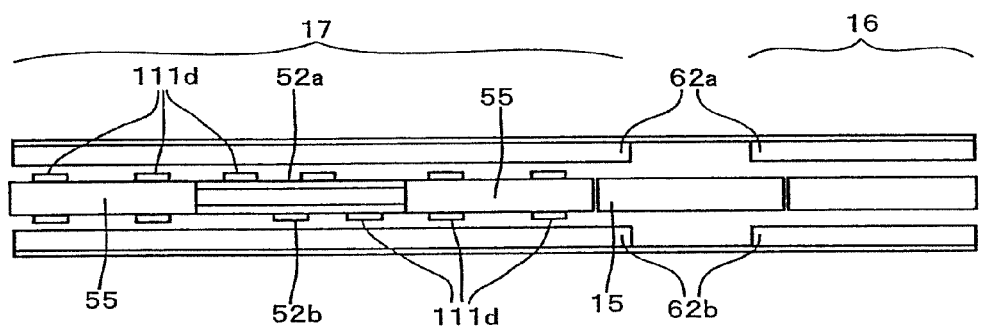
FIG. 9A illustrates a step of a method to manufacture a wiring board according to an embodiment of the present invention.
Figure 9B:
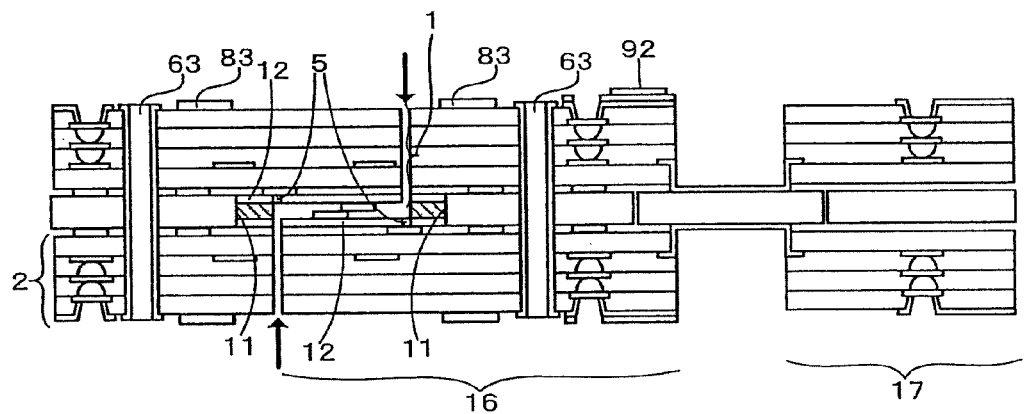
FIG. 9B illustrates a step of a method to manufacture a wiring board according to an embodiment of the present invention.

A method of manufacturing a wiring board according to the embodiment of FIG. 8 is substantially the same as the method of manufacturing a wiring board according to the embodiment in reference to FIGS. 7A-7F, FIGS. 7H-7R and 7T. However, instead of FIG. 7G, as shown in FIG. 9A, cut-out dummy cores (52a, 52b) are placed in a way so that conductive pattern 111*d* are laminated facing outward. Moreover, instead of FIG. 7S, as shown in FIG. 9B, opening 5 is filled with viscous material such as silicone oil.

Figure 10:
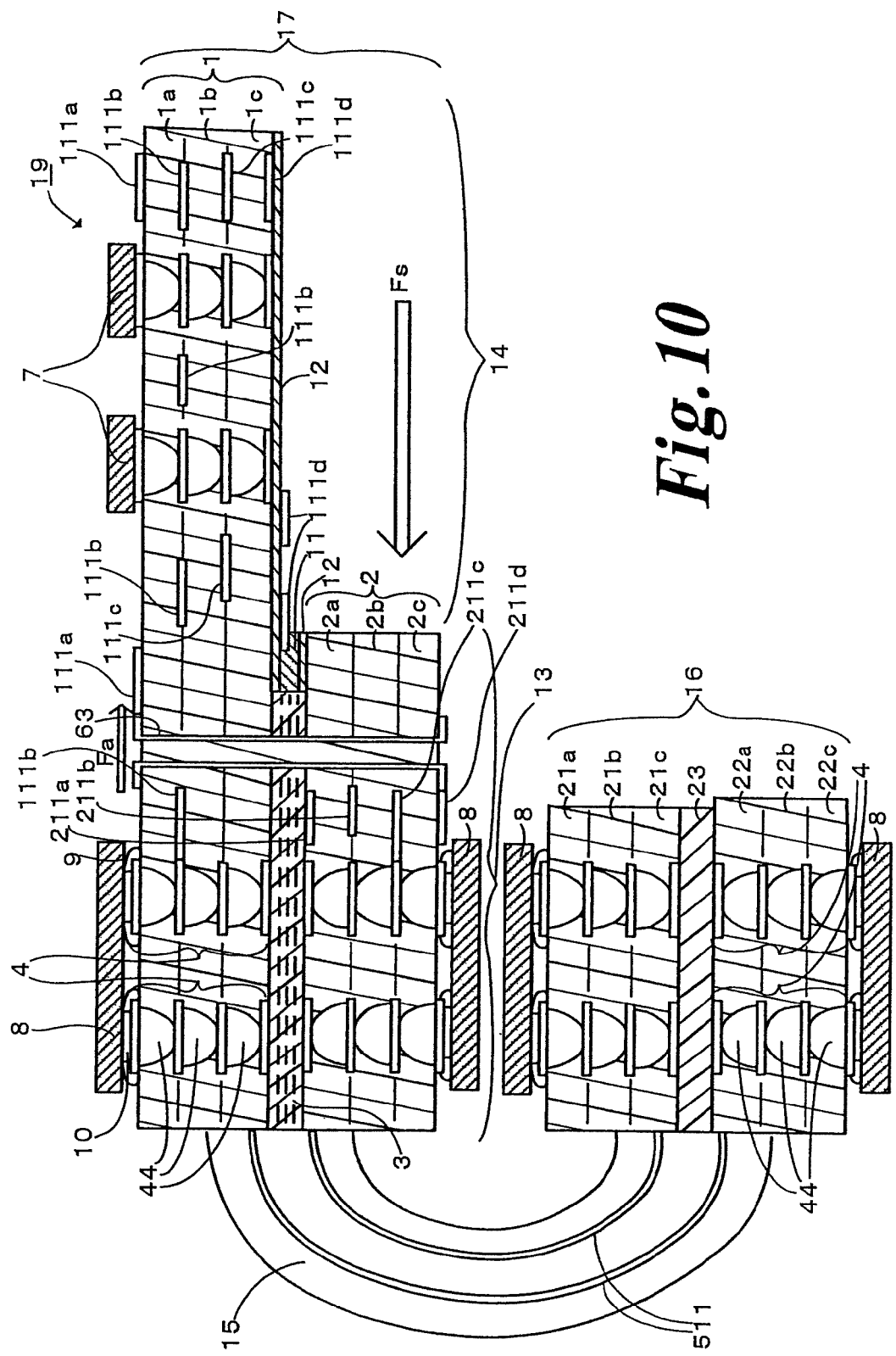
FIG. 10 is a cross-sectional view of a wiring board according to an embodiment of the present invention.

According to the embodiment of FIG. 2, base substrate 3 was made of glass-epoxy resin. However, as shown in FIG. 10, according to another embodiment, base substrate 3 is formed with base material of resin-impregnated inorganic fabric and first substrate 1 is formed with pliable resin. By being formed as such, since base substrate 3 contains base material of resin-impregnated inorganic fabric, tolerance to warping may be improved.

The base material of resin-impregnated inorganic fabric is made by curing a prepreg. Prepreg is made by impregnating glass-cloth inorganic fabric with epoxy-resin, then preliminarily thermosetting the resin to advance the level of curing. The resin used to make prepreg is preferred to have low-flow characteristics, but a resin having regular-flow characteristics may be used as well. Also, the prepreg may be prepared by reducing the content of epoxy-resin impregnated in the glass-cloth inorganic fabric.

As for the inorganic fabric, it is not limited to glass cloth, but may include, for example, alumina fabric, carbon fabric (carbon fiber), silicon carbide fabric or silicon nitride fabric.

In the method of manufacturing a wiring board according to the embodiment of FIG. 10, referring to FIG. 7D, as the material to form core 55, base material of resin-impregnated inorganic fabric is used. Also, as for the resin to form first substrate 1 that will be laminated in reference to FIGS. 7G, 7J, and 7M, pliable resin is used. The rest is substantially the same as the method of manufacturing a wiring board according to the remaining steps in FIGS. 7A-7T.

Figure 11:
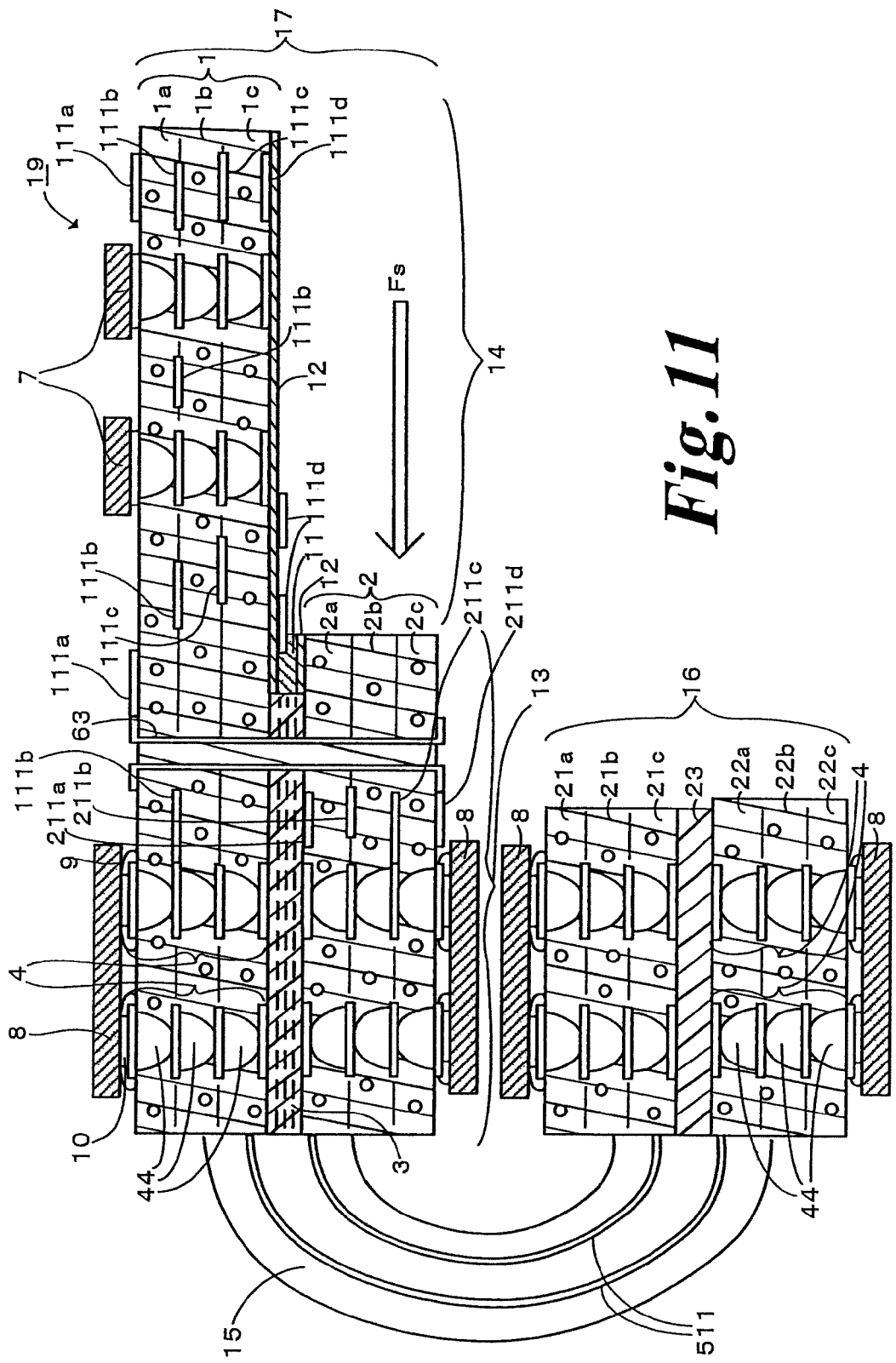
FIG. 11 is a cross-sectional view of a wiring board according to an embodiment of the present invention.

In the above-described embodiment of FIG. 2, base substrate 3 was formed with glass-epoxy resin. First substrate 1 and second substrate 2 were formed with epoxy resin. However, the combination of material for base substrate 3 and material for first substrate 1 and second substrate 2 is not limited to such. As shown in FIG. 11, according to another embodiment, base substrate 3 is formed with base material of resin-impregnated inorganic fabric; and first substrate 1 and second substrate 2 are formed with resin containing inorganic filler. By structuring so, since base substrate 3 includes base material containing resin-impregnated inorganic fabric, tolerance to warping may be improved. Accordingly, when an electronic device such as a cell phone receives an impact from being dropped or the like, the risk of rupture in the wiring that connects electronic components mounted in the wiring board may be minimized.

Resin containing inorganic filler may be made by combining silica filler or glass filler with epoxy resin. In addition to epoxy resin, or other than epoxy resin, polyimide, polycarbonate, polybutylene-telephtarate or polyacrylate may be used.

For silica filler, fused silica ($SiO_2$) or crystalline silica ($SiO_2$) may be used. Also, as for glass filler, aluminum oxide ($Al_2O_3$), magnesium oxide (MgO), boron nitride (BN), or aluminum nitride (AlN) may be used. Furthermore, as for inorganic filler, it is not limited to silica filler or glass filler, but antimony trioxide, antimony pentaxide or magnesium hydroxide may be used.

In the method of manufacturing a wiring board according to the embodiment of FIG. 11, referring to FIG. 7D, as the material to form core 55, base material of resin-impregnated inorganic fabric is used. In addition, for the resin to be laminated in reference to FIGS. 7G, 7J and 7M, resin containing inorganic filler is used. The rest is substantially the same as the method of manufacturing a wiring board according to the remaining steps of FIGS. 7A-7T.

Figure 12:
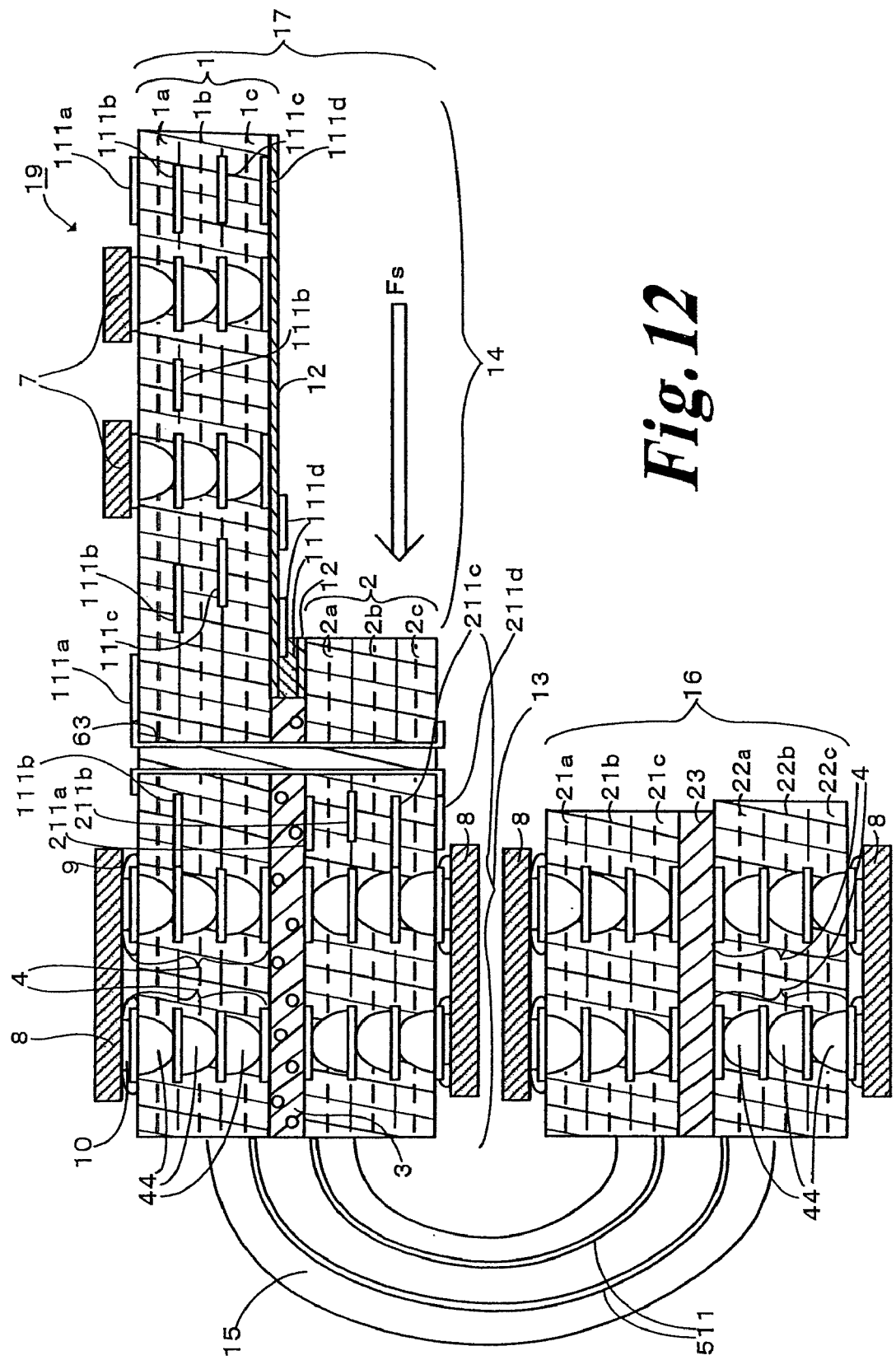
FIG. 12 is a cross-sectional view of a wiring board according to an embodiment of the present invention.

In the above-described embodiment of FIG. 2, base substrate 3 was made of glass-epoxy resin. And first substrate 1 and second substrate 2 were made of epoxy resin. However, the combination of material for base substrate 3 and material for first substrate 1 and second substrate 2 is not limited to the above. As shown in FIG. 12, according to another embodiment, base substrate 3 is formed with resin containing inorganic filler; and first substrate 1 and second substrate 2 are formed with base material of resin-impregnated inorganic fabric. By structuring so, since at least either first substrate 1 or second substrate 2 is reinforced with inorganic fabric, tolerance to warping may be improved. Accordingly, when an electronic device such as a cell phone receives an impact from being dropped or the like, the risk of rupture in the wiring that connects electronic components mounted in the wiring board may be minimized.

The above-described inorganic material such as inorganic fabric or inorganic filler has a small coefficient of thermal expansion and small elasticity compared with resin made of organic material. Therefore, when inorganic material such as inorganic fabric or inorganic filler is combined, alignment gaps between connecting lands may be reduced.

In the method of manufacturing a wiring board according to the embodiment of FIG. 12, referring to FIG. 7D, as the material to form core 55, resin containing inorganic filler is used. In addition, for the resin to be laminated in reference to FIGS. 7G, 7J and 7M, a base material of resin-impregnated inorganic fabric is used. The rest is substantially the same as the method of manufacturing a wiring board according to the remaining steps of FIGS. 7A-7T.

According to the above-described embodiments, pliable member 15 connects base substrate 3, a portion of first substrate 1, a portion of second substrate 2, base member 23, a portion of third substrate 21 and a portion of fourth substrate 22. However, the manner in which pliable member 15 connects first wiring board 17 and second wiring board 16 is not limited to such an embodiment.

Figure 13A:
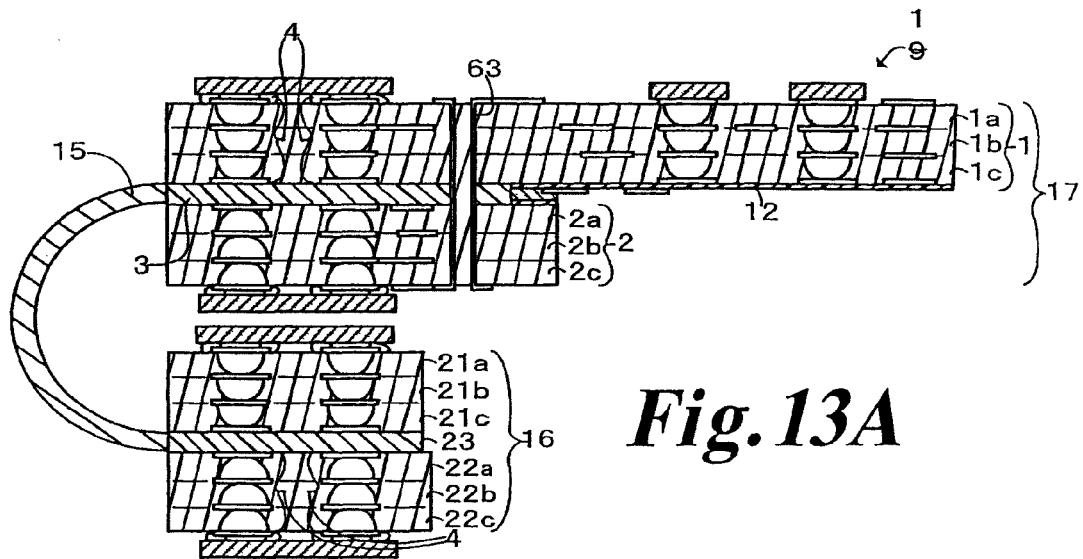
FIG. 13A is a cross-sectional view of a wiring board according to an embodiment of the present invention.

As shown in FIG. 13A, pliable member 15 may also connect first wiring board 17 and second wiring board 16 by connecting base substrate 3 and base member 23. Furthermore, by forming base substrate 3 or base member 23 with pliable material and by extending base substrate 3 or base member 23, either base substrate 3 or base member 23 may serve as pliable member 15 and connect first wiring board 17 and second wiring board 16.

Figure 13B:
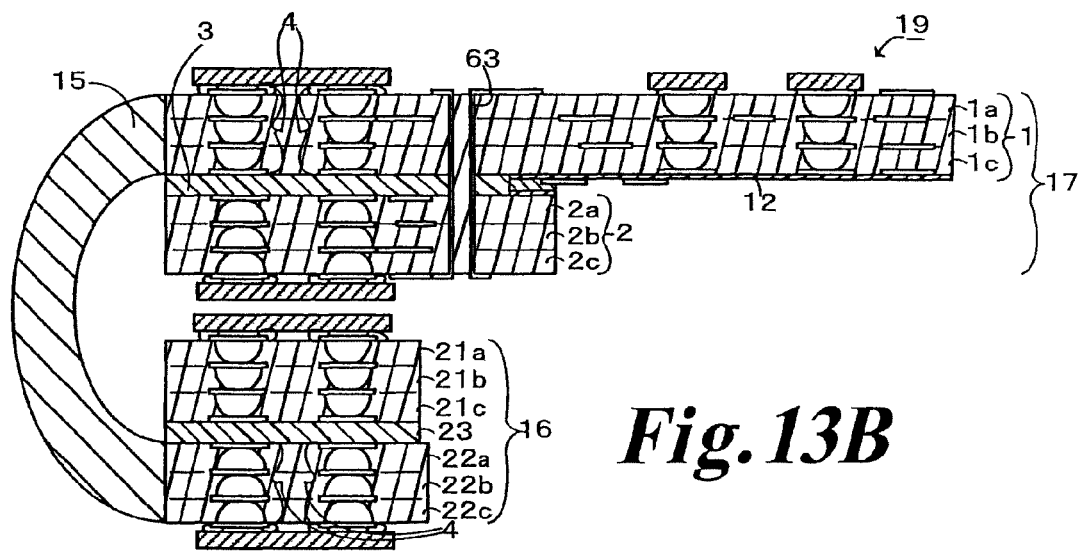
FIG. 13B is a cross-sectional view of a wiring board according to an embodiment of the present invention.

Also, as shown in FIG. 13B, pliable member 15, by connecting first substrate 1 and fourth substrate 22, may also connect first wiring board 17 and second wiring board 16.

Figure 13C:
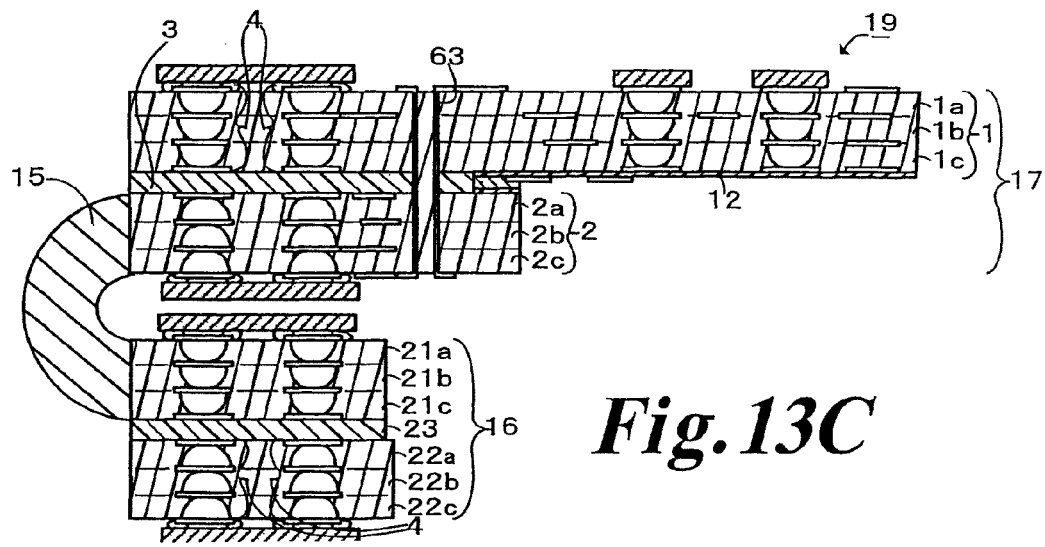
FIG. 13C is a cross-sectional view of a wiring board according to an embodiment of the present invention.

Also, as shown in FIG. 13C, pliable member 15, by connecting second substrate 2 and third substrate 21, may also connect first wiring board 17 and second wiring board 16.

Figure 13D:
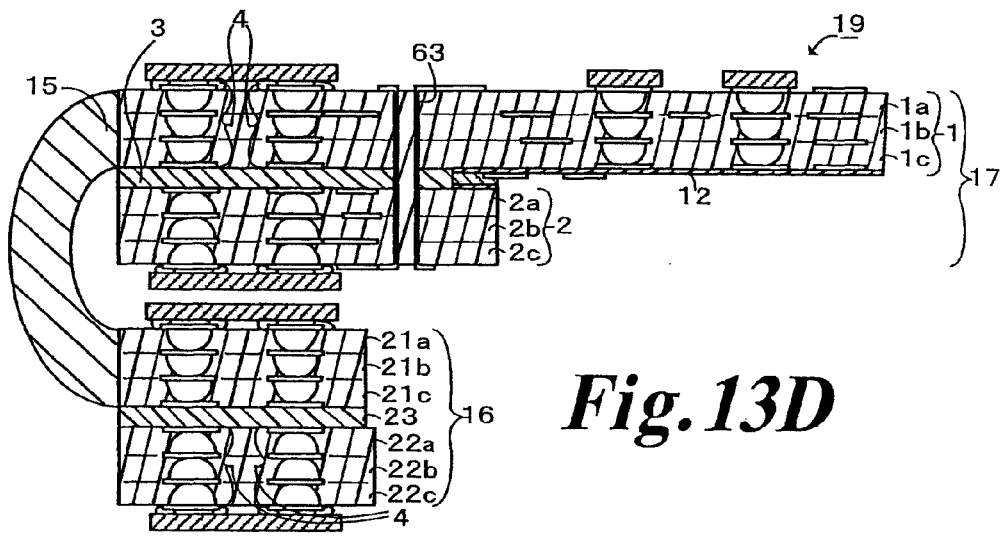
FIG. 13D is a cross-sectional view of a wiring board according to an embodiment of the present invention.

Also, as shown in FIG. 13D, pliable member 15, by connecting first substrate 1 and third substrate 21, may also connect first wiring board 17 and second wiring board 16.

Figure 13E:
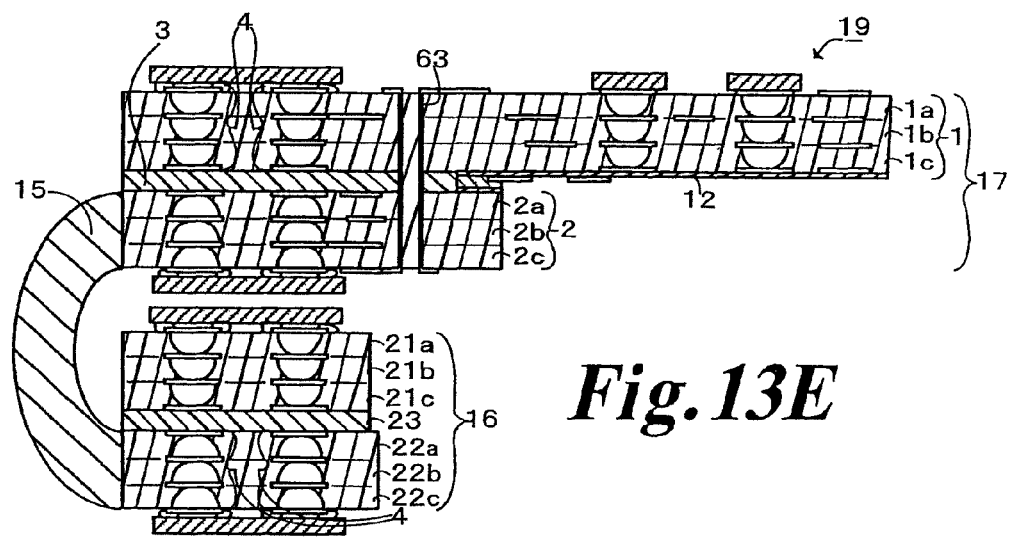
FIG. 13E is a cross-sectional view of a wiring board according to an embodiment of the present invention.

Also, as shown in FIG. 13E, pliable member 15, by connecting second substrate 2 and fourth substrate 22, may also connect first wiring board 17 and second wiring board 16.

Figure 13F:
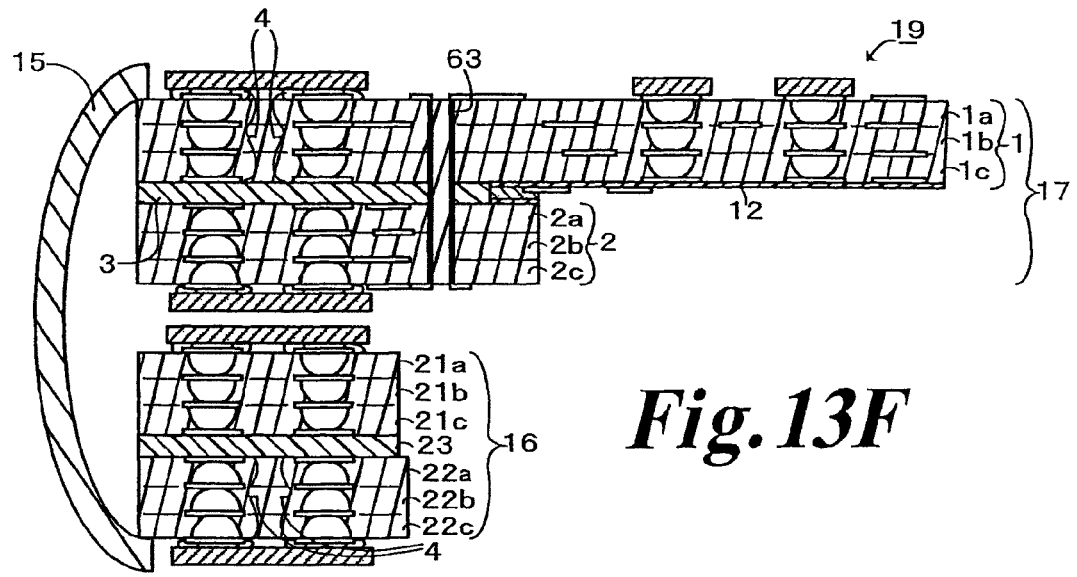
FIG. 13F is a cross-sectional view of a wiring board according to an embodiment of the present invention.

Also, as shown in FIG. 13F, pliable member 15, by connecting the mounting surface of first substrate 1 and the mounting surface of fourth substrate 22, may also connect first wiring board 17 and second wiring board 16.

Figure 13G:
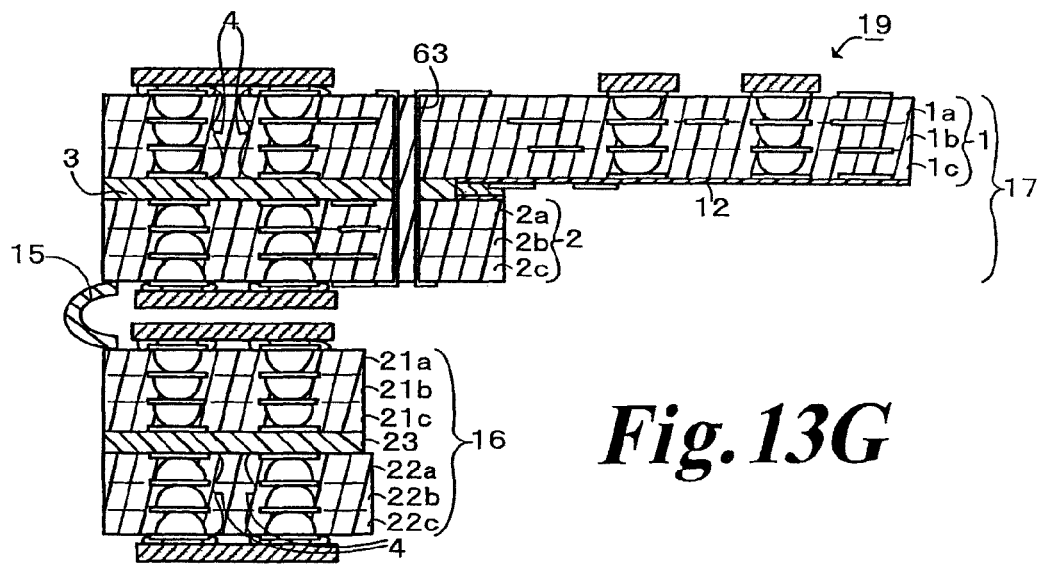
FIG. 13G is a cross-sectional view of a wiring board according to an embodiment of the present invention.

Also, as shown in FIG. 13G, pliable member 15, by connecting the mounting surface of second substrate 2 and the mounting surface of third substrate 21, may also connect first wiring board 17 and second wiring board 16.

As noted above, embodiments of the invention are not limited to one end of first substrate 1 and one end of second substrate 2 being aligned. As shown in FIG. 14A, one end of second substrate 2 may protrude from one end of first substrate 1, and one end of the first substrate 1 may protrude from the second substrate 2. Here, the protruding portions of the first and second substrates make up a periphery portion of the wiring board that is thinner than a center portion of the wiring board which includes the first substrate 1, second substrate 2 and base 3.

Also, as shown in FIG. 14B, opposite ends of first substrate 1 may protrude from ends of second substrate 2. Here, the protruding portions of only the first and second substrate make up a periphery portion of the wiring board that is thinner than a center portion of the wiring board which includes the first substrate 1, second substrate 2 and base 3.

Moreover, according to the above-described embodiments, second wiring board 16 is formed by laminating third substrate 21, base member 23 and fourth substrate 22. However, such is not the only embodiment. Second wiring board 16, for example, as shown in FIG. 15A, may be formed by laminating multiple insulation layers instead of using base member 23. Further, as shown in FIG. 15B, second wiring board 16 may be structured with a single resin layer.

In a wiring board according to the embodiment of the present invention in FIG. 2, first substrate 1 and second substrate 2 are in a layered structure having a rectangular outline. However, they are not limited to such, but may be in a layered structure having a circular, hexagonal or octagonal outline.

Also, according to the embodiment of FIG. 2, first substrate 1, second substrate 2, third substrate 21 and fourth substrate 22 are formed with epoxy resin. However, they are not limited to such; first substrate 1, third substrate 21 and fourth substrate 22 may be made of various materials such as polyimide, polycarbonate, polybutylene-telephtarate or polyacrylate. Also, second substrate 2 is not limited to epoxy resin, but various materials may be used as long as they are non-pliable. In addition, if first substrate 1, second substrate 2, third substrate 21 and fourth substrate 22 are made of epoxy resin, naphthalene-type epoxy resin, dicyclo-penta-diene-type epoxy resin, biphenyle-type epoxy resin or bisphenole-type epoxy resin may be used.

In the embodiment of FIG. 2, as for solder 9, Sn/Ag/Cu was used. However, solder 9 is not limited to such; solder containing antimony, tin, lead, indium or copper may be used. Also, eutectic crystal metals such as Sn/Sb, Sn/Ag, Sn/Pb or Sb/Cu may be used as well. Among such eutectic crystal metals, to avoid having a bad influence on the substrates, using metals having relatively low melting temperatures, 250° C. or lower, is preferred.

According to the embodiment of FIG. 2, interlayer groove section 11 is filled with silicone gel which is viscous silicone. However, filling interlayer groove section 11 is not limited to such, but solid material may be used. As for solid material to be filled in interlayer groove section 11, high-polymer rubber is preferred as a solid material having viscosity and elasticity. More specifically, butyl rubber, isoprene rubber, butadiene rubber, styrene-butadiene rubber or ethylene-propylene rubber may be used. Moreover, interlayer groove section 11 may be filled with a gas. As for the gas to be filled in interlayer groove section 11, a rare gas such as argon, or nitrogen or oxygen may also be used.

According to the embodiment of FIG. 8, in opening 5, silicone gel which is viscous silicone is filled. However, the material to be filled in opening 5 is not limited to such, but solid material may be used. As for solid material to be filled in opening 5, high-polymer rubber as a solid material having viscosity and elasticity is preferred. More specifically, butyl rubber, isoprene rubber, butadiene rubber, styrene-butadiene rubber or ethylene-propylene rubber may be used. As for the material to be filled in opening 5, a liquid or solid material is preferred, but a gas may be used. In such a case, as the gas to be filled in opening 5, a rare gas such as argon, or nitrogen or oxygen may be used.

In addition, first substrate 1 is not necessarily formed single-layered, but may be formed multi-layered. Namely, first substrate 1 may be structured with a lower-layer insulation layer and an upper-layer insulation layer. Here, a lower-layer insulation layer indicates the insulation layer formed close to base substrate 3; and an upper-layer insulation layer indicates an insulation layer formed on the outer surface of the wiring board. Furthermore, first substrate 1 may be structured with a lower-layer insulation layer, an upper-layer insulation layer and an intermediate insulation layer placed in between. The intermediate insulation layer may be made multi-layered. In the embodiment of FIG. 2, the lower-layer insulation layer corresponds to epoxy-resin layer (1c), the intermediate insulation layer corresponds to epoxy-resin layer (1b) and the upper-layer insulation layer corresponds to epoxy-resin layer (1a).

Also, the second substrate is not necessarily formed single-layered, but may be formed multi-layered. Second substrate 2 may also be structured with a lower-layer insulation layer and an upper-layer insulation layer. Furthermore, second substrate 2 may be structured with a lower-layer insulation layer, an upper-layer insulation layer and an intermediate insulation layer placed in between. In the embodiment of FIG. 2, the lower-layer insulation layer corresponds to epoxy-resin layer 2a, the intermediate insulation layer corresponds to epoxy-resin layer 2b and the upper-layer insulation layer corresponds to epoxy-resin layer 2c. On top of the upper-layer insulation layer and lower-layer insulation layer, conductive patterns are formed. And, those conductive patterns may be connected with each other through vias 44.

The present invention may be employed in a wiring board which can mount electronic components, specifically, in a wiring board which can mount electronic components for compact electronic devices.

What is claimed is:

1. A method of manufacturing a wiring board comprising: forming a first wiring board by forming a base substrate, forming a first insulation layer on a first surface of the base substrate and a second insulation layer on a second surface of the base substrate opposing the first surface, at least one of the first insulation layer and a second insulation layer being a non-pliable insulation layer, forming at least one via in at least one of the first and second insulation layers, and cutting the first insulation layer in a first area and cutting the second insulation layer in a second area offset from said first area to form a first substrate laminated to a second substrate with the base layer interposed therebetween, the second substrate having a smaller mounting area than a mounting area of the first substrate such that the first substrate extends beyond an edge of the second substrate;

connecting a pliable member to the base substrate of the first wiring board;

connecting the pliable member to a second wiring board to thereby connect the first wiring board to the second wiring board; forming an interlayer groove portion between the first substrate and the second substrate; and filling the interlayer groove portion with at least one of a gas, liquid or solid material.

2. The method of manufacturing a wiring board according to claim 1, further comprising forming a through-hole which penetrates the base substrate.

3. The method of manufacturing a wiring board according to claim 1, further comprising forming a warping prevention portion at a step portion formed by the first substrate and the second substrate laminated with the base substrate interposed therebetween.

4. The method of manufacturing a wiring board according to claim 1,
wherein the interlayer groove portion is an opening formed at a step portion formed by the first substrate and the second substrate laminated with the base substrate interposed therebetween.

5. The method of manufacturing a wiring board according to claim 1, wherein:
said forming the base substrate comprises forming the base substrate with a base material of resin-impregnated inorganic fabric; said forming the first substrate comprises forming the first substrate with either resin containing inorganic filler or pliable resin; and said forming the second substrate comprises forming the second substrate with either a resin containing inorganic filler or a non-pliable resin.

6. The method of manufacturing a wiring board according to claim 5, wherein said forming the base substrate comprises forming the base substrate with a resin-impregnated inorganic fabric comprising glass cloth.

7. The method of manufacturing a wiring board according to claim 5, wherein said inorganic filler comprises either silica filler or glass filler.

8. The method of manufacturing a wiring board according to claim 1, wherein the base substrate is formed with resin containing inorganic filler, and at least one of the first substrate and the second substrate is formed with a base material of a resin-impregnated inorganic fabric.

9. The method of manufacturing a wiring board according to claim 8, wherein the resin-impregnated inorganic fabric comprises glass cloth.

10. The method of manufacturing a wiring board according to claim 8, wherein the inorganic filler comprises either silica filler or glass filler.

11. The method of manufacturing a wiring board according to claim 1, further comprising:
forming a conductive pattern on the first substrate;
forming a conductive pattern on the second substrate; and
connecting the conductive pattern on the first substrate and the conductive pattern on the second substrate by a through-hole.

12. The method of manufacturing a wiring board according to claim 1, further comprising:
forming a conductive layer on an inner surface of the via by plating; and
filling the via with metal.

13. The method of manufacturing a wiring board according to claim 1, further comprising:
forming a conductive layer on an inner surface of the via by plating; and
filling the via with resin.

14. The method of manufacturing a wiring board according to claim 1, wherein:
the forming the first substrate comprises forming the first substrate with a first lower-layer insulation layer and a first upper-layer insulation layer; and
the forming the second substrate comprises forming the second substrate with a second lower-layer insulation layer and a second upper-layer insulation layer.

15. The method of manufacturing a wiring board according to claim 14, further comprising:
forming a conductive pattern on each of the upper-layer insulation layers;
forming a conductive pattern on each of the lower-layer insulation layers; and
connecting each conductive pattern on the upper-layer insulation layers to a respective conductive pattern on the lower-layer insulation layers through vias.

16. The method of manufacturing a wiring board according to claim 1, wherein on the surface of the pliable member, a conductive pattern is formed.

* * * * *